(12) United States Patent
Lin et al.

(10) Patent No.: US 12,382,724 B2
(45) Date of Patent: Aug. 5, 2025

(54) LAYOUT DESIGN FOR HEADER CELL IN 3D INTEGRATED CIRCUITS

(71) Applicant: TAIWAN SEMICONDUCTOR MANUFACTURING COMPANY LTD., Hsinchu (TW)

(72) Inventors: Cheng-Yu Lin, Hsinchu (TW); Po-Hsiang Huang, Tainan (TW); Pochun Wang, Hsinchu (TW); Chih-Liang Chen, Hsinchu (TW); Fong-Yuan Chang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 139 days.

(21) Appl. No.: 17/333,722

(22) Filed: May 28, 2021

(65) Prior Publication Data
US 2022/0384414 A1    Dec. 1, 2022

(51) Int. Cl.
*H10D 84/03* (2025.01)
*H10D 88/00* (2025.01)
*H10D 89/10* (2025.01)
H10D 84/01 (2025.01)
H10D 84/85 (2025.01)

(52) U.S. Cl.
CPC ............. *H10D 89/10* (2025.01); *H10D 88/00* (2025.01); *H10D 84/0191* (2025.01); *H10D 84/038* (2025.01); *H10D 84/854* (2025.01)

(58) Field of Classification Search
CPC ............. H01L 27/0207; H01L 27/0688; H01L 27/0921; H10D 89/10; H10D 88/00
USPC .......................... 257/208, 758; 438/128, 622
See application file for complete search history.

(56) References Cited

U.S. PATENT DOCUMENTS

| | | | | |
|---|---|---|---|---|
| 8,549,460 | B2* | 10/2013 | Law | H01L 23/5286 716/120 |
| 9,030,025 | B2* | 5/2015 | Huang | H01L 23/481 257/774 |
| 9,214,374 | B2* | 12/2015 | Lee | H01L 21/76898 |
| 9,754,923 | B1* | 9/2017 | Xie | H01L 23/5226 |
| 9,985,207 | B2* | 5/2018 | Hayton | H01L 51/0017 |
| 10,002,820 | B2* | 6/2018 | Jan | H01L 23/481 |
| 10,818,799 | B2* | 10/2020 | Pillarisetty | H01L 29/4232 |
| 10,826,492 | B2* | 11/2020 | Dubey | H01L 25/0657 |
| 10,833,032 | B2* | 11/2020 | Son | H01L 25/0657 |
| 10,854,530 | B1* | 12/2020 | Cheng | H01L 25/0657 |
| 2010/0130002 | A1* | 5/2010 | Dao | H01L 23/481 257/E21.495 |
| 2010/0171226 | A1* | 7/2010 | West | H01L 23/481 257/774 |
| 2010/0270597 | A1* | 10/2010 | Sproch | G06F 30/392 257/621 |

(Continued)

*Primary Examiner* — Eugene Lee
(74) *Attorney, Agent, or Firm* — WPAT LAW; Anthony King

(57) ABSTRACT

A semiconductor device and a method for manufacturing a semiconductor device are provided. The semiconductor device comprises a substrate, a conductive element disposed within a first region of the substrate, and a first transistor disposed within a second region adjacent to the first region of the substrate. The conductive element is electrically connected to an electrode of the first transistor, and the conductive element penetrates the substrate and is configured to receive a supply voltage.

20 Claims, 30 Drawing Sheets

(56) References Cited

U.S. PATENT DOCUMENTS

| | | | |
|---|---|---|---|
| 2014/0008817 A1* | 1/2014 | Horng | H01L 23/481 |
| | | | 257/774 |
| 2014/0308784 A1* | 10/2014 | Mallikarjunaswamy | |
| | | | H01L 21/8234 |
| | | | 438/237 |
| 2015/0348962 A1* | 12/2015 | Chao | H01L 21/768 |
| | | | 257/207 |
| 2018/0261611 A1* | 9/2018 | Norizuki | H01L 27/11565 |
| 2019/0259702 A1* | 8/2019 | Jain | H01L 23/481 |
| 2019/0273089 A1* | 9/2019 | Yamamoto | H01L 21/76816 |
| 2020/0083225 A1* | 3/2020 | Ma | G11C 11/401 |
| 2020/0227411 A1* | 7/2020 | Wang | H01L 29/42364 |
| 2022/0037307 A1* | 2/2022 | Lee | H01L 23/481 |
| 2022/0254739 A1* | 8/2022 | Ku | H01L 21/76898 |

\* cited by examiner

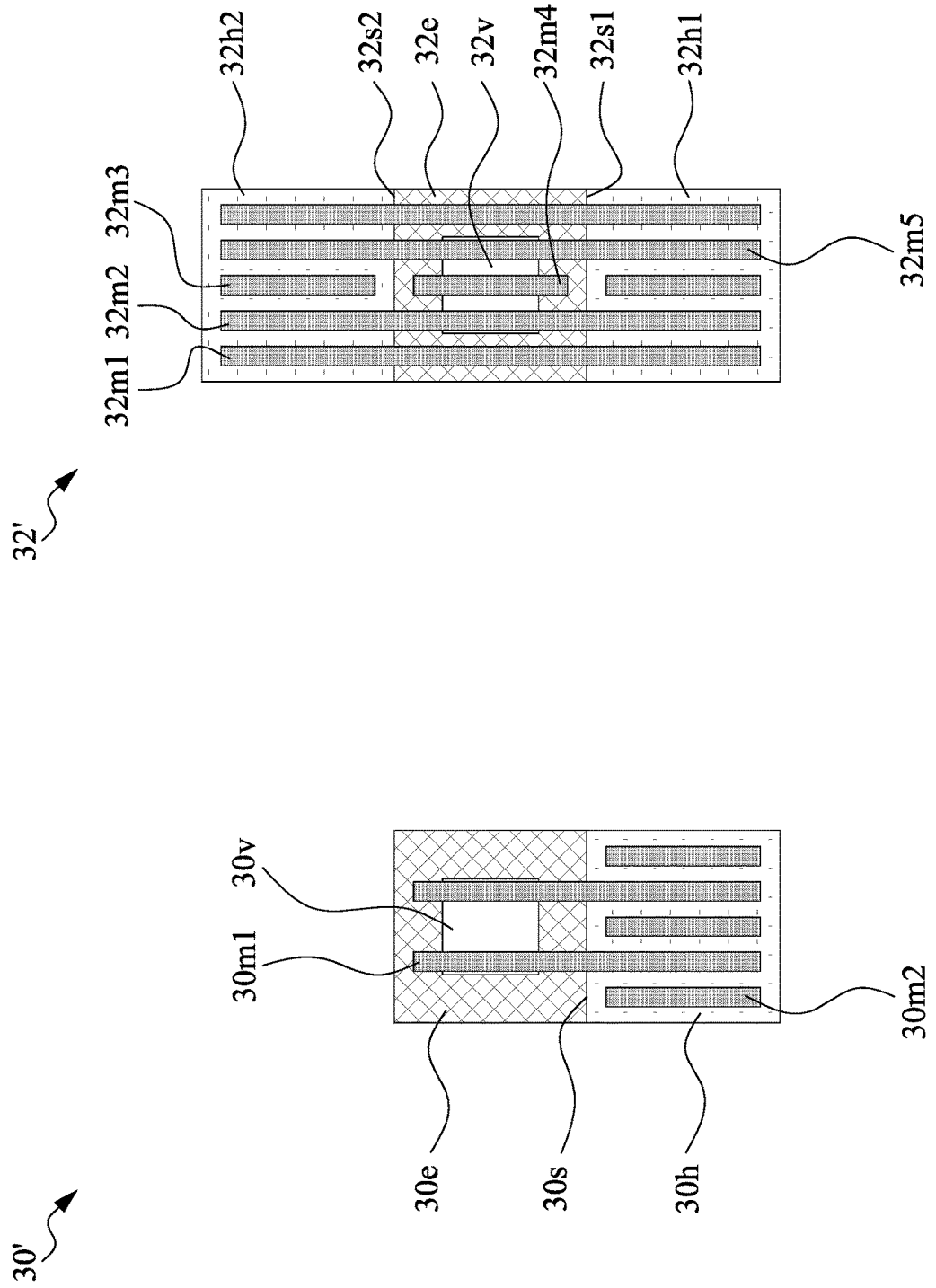

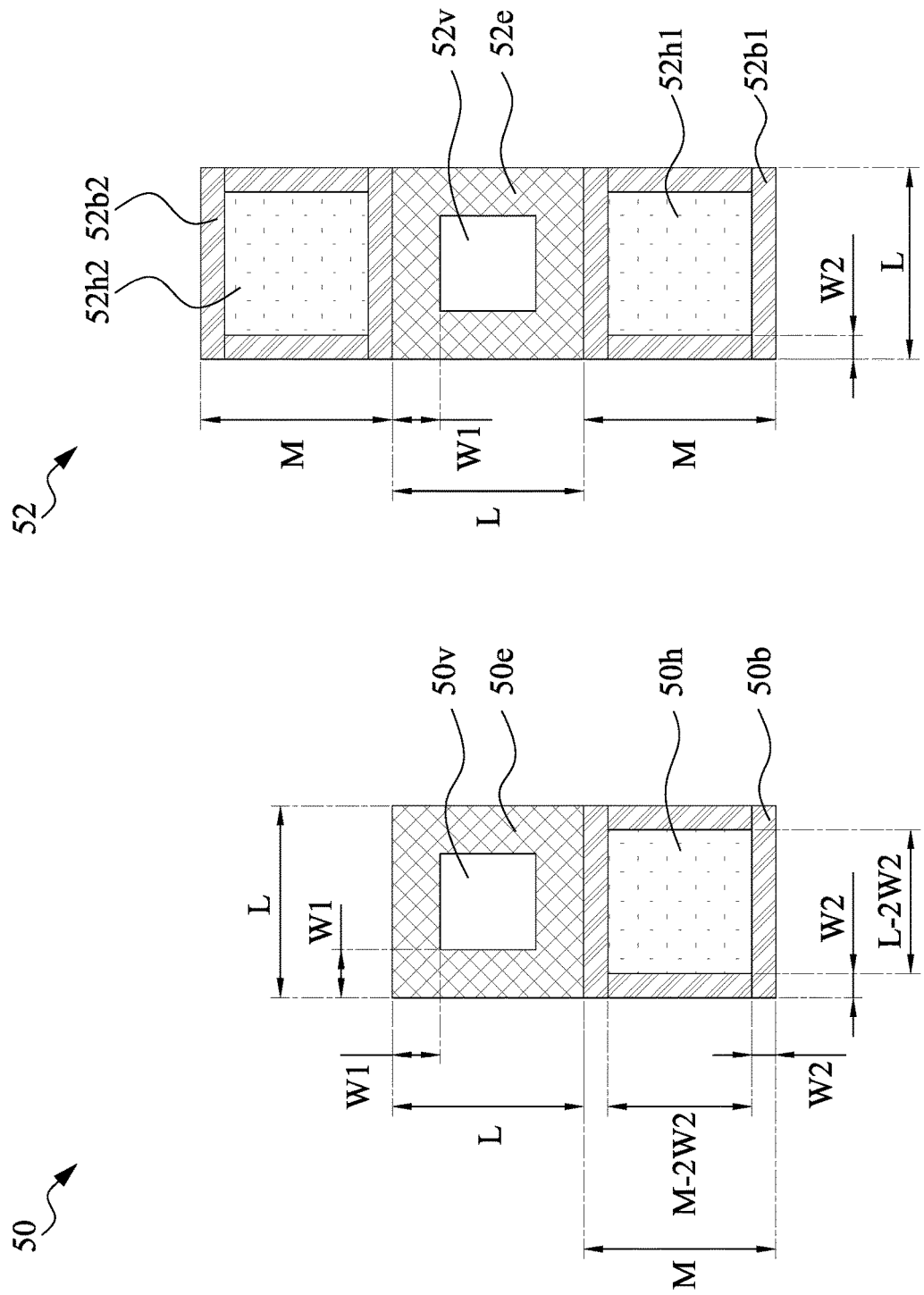

LAYOUT DESIGN FOR HEADER CELL IN 3D INTEGRATED CIRCUITS

BACKGROUND

The present disclosure relates, in general, to semiconductor devices and methods for manufacturing the same. Specifically, the present disclosure relates to layout design for header cell in three-dimensional (3D) integrated circuits (ICs).

Power Gating is a technique used in IC design to reduce power consumption, by shutting off the current to blocks of the circuit that are not in use. Power gating is used to save the leakage power when the system is not in operation. This is accomplished by adding a switch either to VDD or VSS supply. Powering off a design block can be a beneficial technique because near zero power will be dissipated. When a positive supply voltage VDD is gated the power switch is referred to as the "header" switch. Similarly if a negative supply voltage VSS is gated it can be referred to as a "footer" switch. A "header" switch in the layout design stage can be referred to as a "header" cell, and a "footer" switch in the layout design stage can be referred to as a "footer" cell.

In a 3D IC structure, multiple wafers are stacked vertically, while pins to the ICs can only be placed on the back side of each wafer. Through-silicon via (TSV) can be utilized for connecting supply voltages to the header cells. Various embodiments of header cell designs in 3D IC structures are provided in the present disclosure.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 4A is a top view of a layout of a semiconductor device, in accordance with some embodiments of the present disclosure.

FIG. 4B is a top view of a layout of a semiconductor device, in accordance with some embodiments of the present disclosure.

FIG. 5A is a top view of a layout of a semiconductor device, in accordance with some embodiments of the present disclosure.

FIG. 5B is a top view of a layout of a semiconductor device, in accordance with some embodiments of the present disclosure.

DETAILED DESCRIPTION

Figure 1:
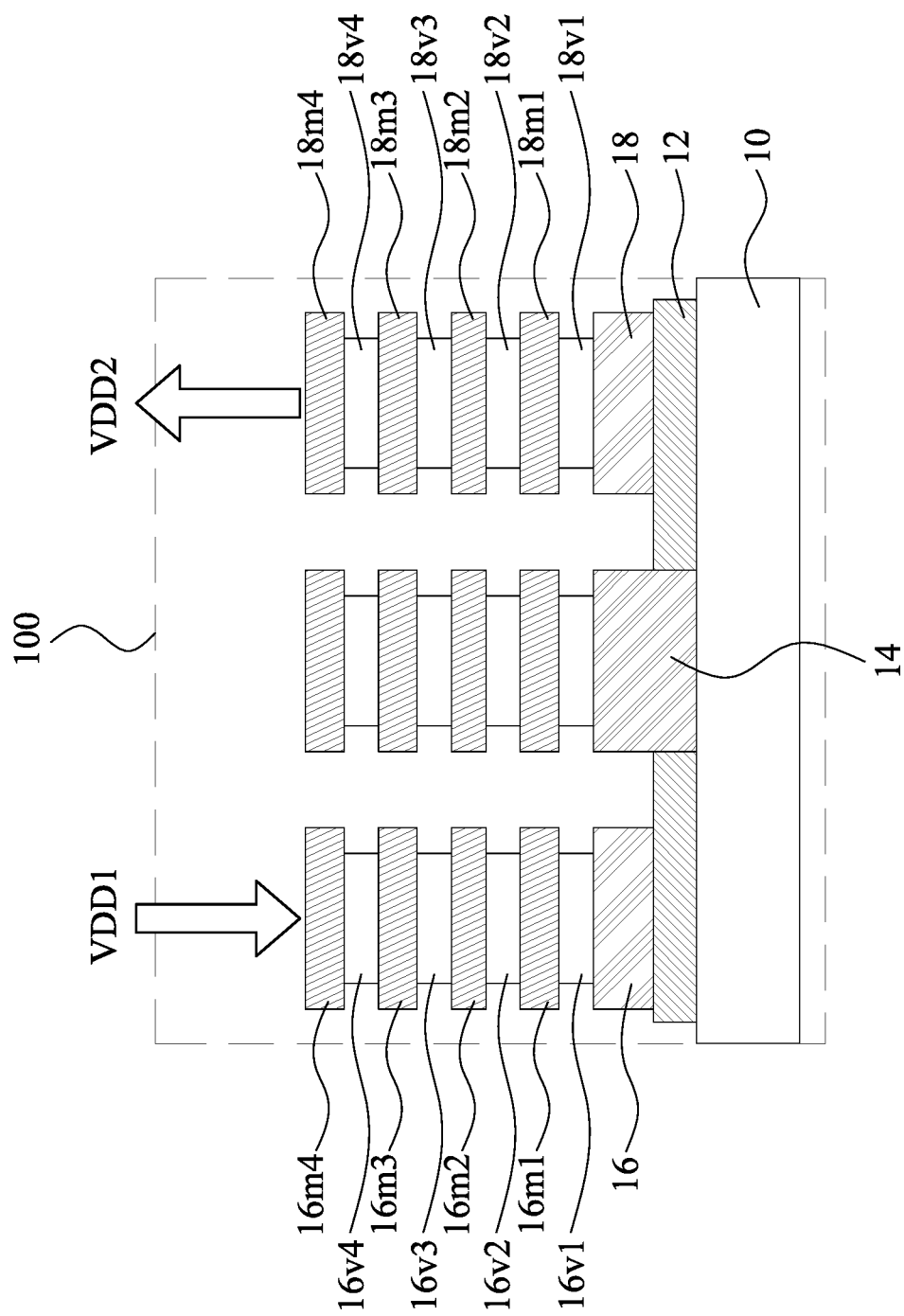
FIG. 1 is a cross-section of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a cross-section of a semiconductor device, in accordance with some embodiments of the present disclosure.

FIG. 1 shows a device 100. The device 100 can be an electronic device. The device 100 can be a semiconductor device. The device 100 can be a portion of a system of ICs. The device 100 can be a transistor. The device 100 can be a header cell. The "header cell" mentioned in the present disclosure can refer to a switch/transistor that can control whether power/current is provided to a subsequent stage of the system of ICs.

The device 100 includes a substrate 10, an active layer 12, a gate terminal 14, and electrodes 16 and 18. Several conductive layers can be disposed above the gate terminal 14 and the electrodes 16 and 18. Several conductive layers can be electrically connected to the gate terminal 14, the electrode 16, or the electrode 18.

In some embodiments, conductive layers 16m1, 16m2, 16m3 and 16m4 can be disposed above and electrically connected to the electrode 16. The conductive layers 16m1, 16m2, 16m3 and 16m4 can be electrically connected to the electrode 16 through, for example, conductive vias 16v1, 16v2, 16v3 and 16v4. In some embodiments, more than four layers of conductive layers can be disposed above and electrically connected to the electrode 16. In some embodiments, fewer than four layers of conductive layers can be disposed above and electrically connected to the electrode 16.

In some embodiments, conductive layers 18m1, 18m2, 18m3 and 18m4 can be disposed above and electrically connected to the electrode 18. The conductive layers 18m1, 18m2, 18m3 and 18m4 can be electrically connected to the electrode 18 through, for example, conductive vias 18v1, 18v2, 18v3 and 18v4. In some embodiments, more than four layers of conductive layers can be disposed above and electrically connected to the electrode 18. In some embodiments, fewer than four layers of conductive layers can be disposed above and electrically connected to the electrode 18.

Although not labeled in FIG. 1, several layers of conductive layers can be disposed above and electrically connected to the gate terminal 14. The conductive layers disposed above the gate terminal 14 can be electrically connected to the gate terminal 14 through, for example, several conductive vias.

A supply voltage VDD1 can be applied to the electrode 16. Referring to FIG. 1, the supply voltage VDD1 can be applied to the electrode 16 through the topmost conductive layer 16*m*4. A supply voltage VDD2 can be generated on the electrode 18 when the gate terminal 14 is turned on. The supply voltage VDD2 generated on the electrode 18 can be provided to a circuit in the next stage through the topmost conductive layer 18*m*4.

The conductive layers 16*m*1, 16*m*2, 16*m*3 and 16*m*4 are located at the back side of the device 100. In the embodiment shown in FIG. 1, since no other circuit is stacked at the back side of the device 100, the supply voltage VDD1 can be applied to the device 100 from its back side, and the supply voltage VDD2 can be provided from the back side of the device 100.

Figure 2A:
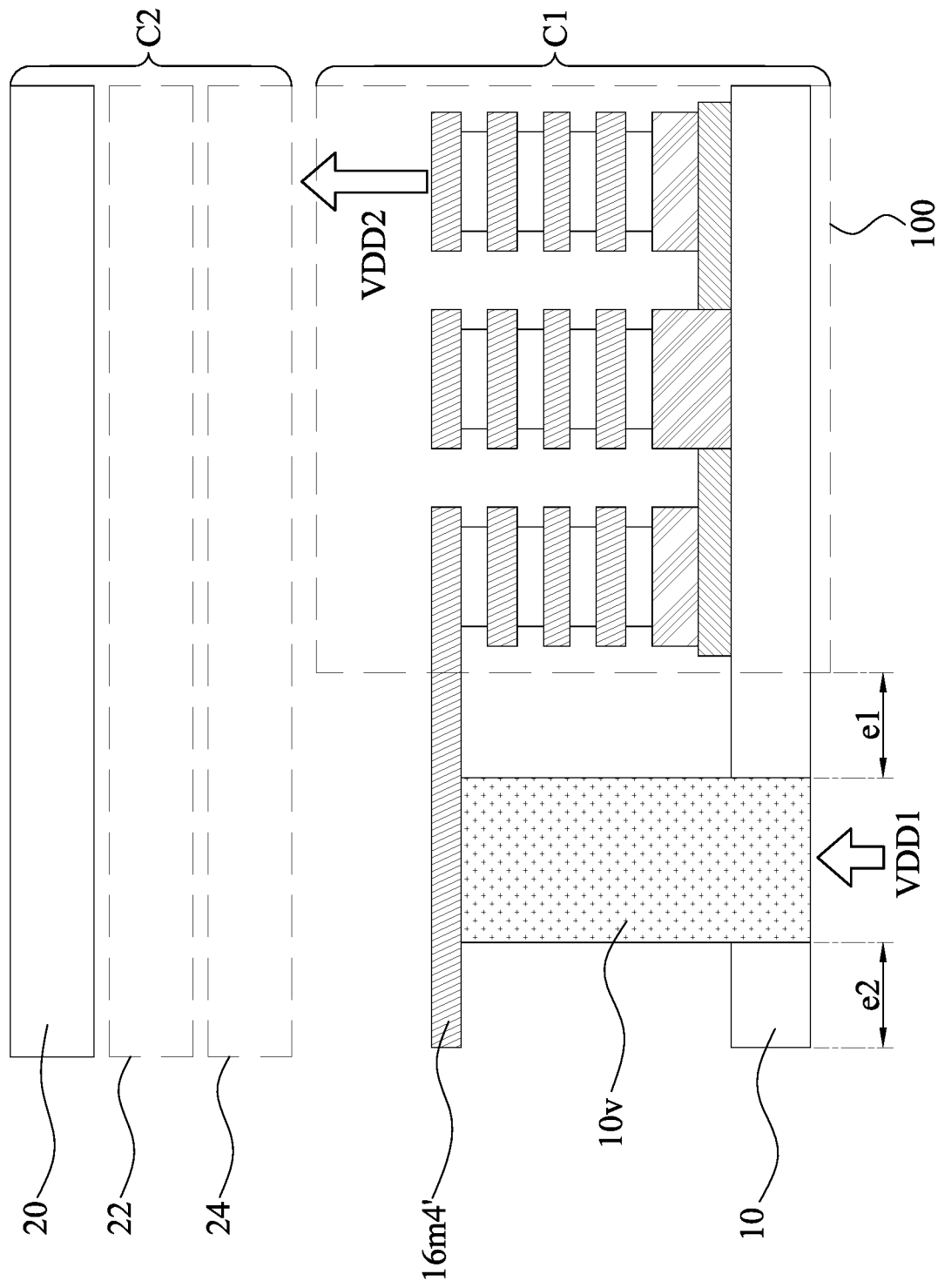
FIG. 2A is a cross-section of a semiconductor device, in accordance with some embodiments of the present disclosure.

FIG. 2A is a cross-section of a semiconductor device, in accordance with some embodiments of the present disclosure.

The semiconductor device shown in FIG. 2A includes a device C1 and a device C2. The devices C1 and C2 can each be an electronic device. The devices C1 and C2 can each be an IC. The device C1 includes a device 100. The device 100 shown in FIG. 2A is substantially identical to that shown in FIG. 1, except that the conductive layer 16*m*4' is electrically connected to a conductive element 10*v*. The conductive element 10*v* penetrates the substrate 10. The conductive element 10*v* can be referred to as a through-silicon via (TSV).

The device C2 includes a substrate 20 and a routing area 22. The device C2 can be any semiconductor device that can be electrically connected to the device C2. The devices C1 and C2 can be electrically connected with each other through the interconnections within the connection area 24. In the embodiment shown in FIG. 2A, the device C2 can be referred to as "stacked" on the device C1. The device C2 can be stacked on the back side of the device C1, and the device C1 can be stacked on the back side of the device C2. The structure shown in FIG. 2A can be referred to as a 3D IC structure.

In the 3D IC structure shown in FIG. 2A, the supply voltage VDD1 can be applied to the device C1 through the conductive element 10*v*. The supply voltage VDD2 can be provided by the device C1 to the device C2 through the interconnections within the connection area 24.

A space e1 exists between the device 100 and the conductive element 10*v*. A space e2 exists between conductive element 10*v* and a semiconductor device (not shown) adjacent to the conductive element 10*v*.

The formation of the conductive element 10*v* involves creating an opening on the substrate 10. In general, no circuit/device will be located within the space e1 and the space e2. The space e1 and e2 can prevent the circuit/device from being damaged during the formation of the conductive element 10*v*.

Figure 2B:
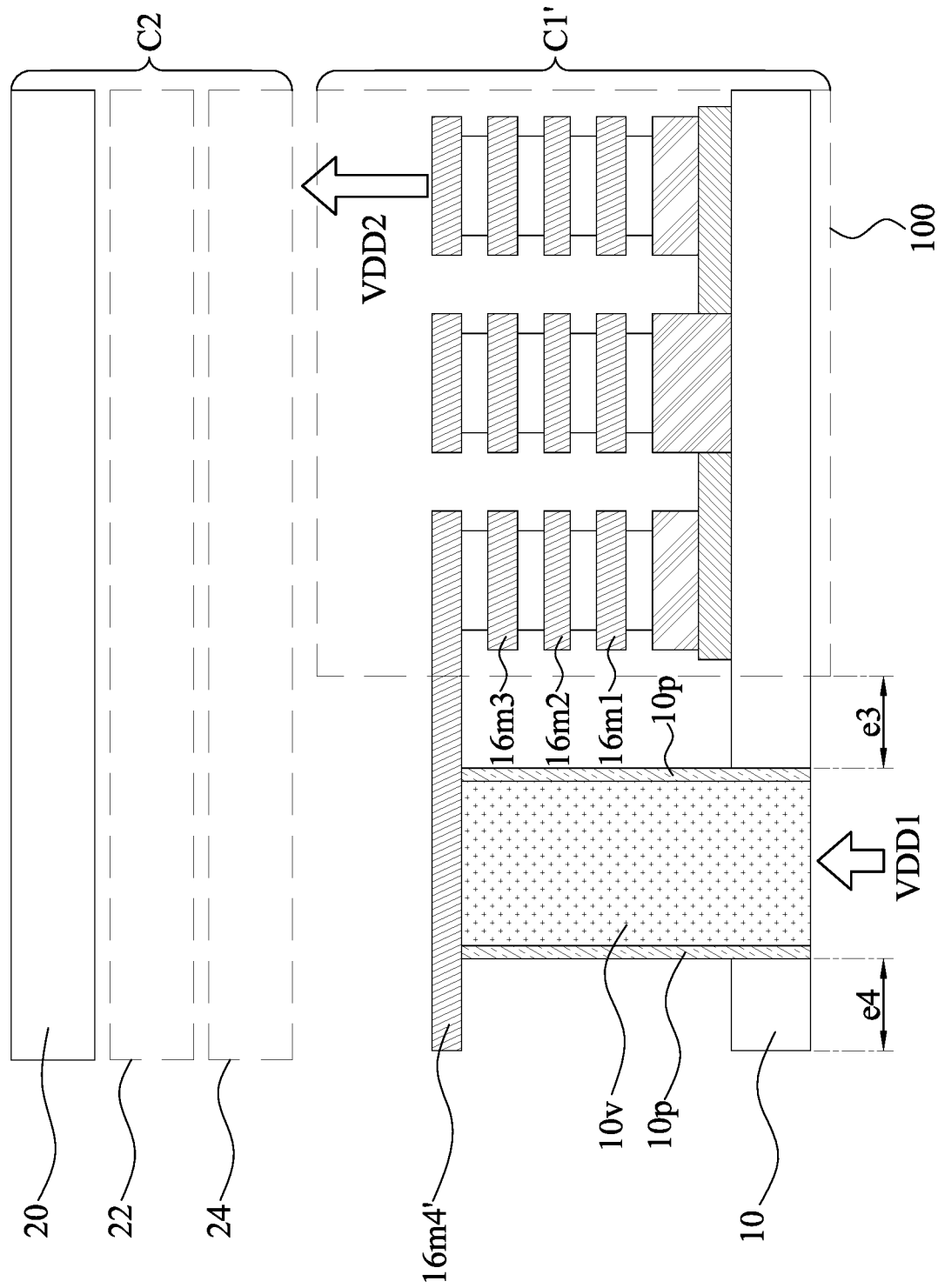
FIG. 2B is a cross-section of a semiconductor device, in accordance with some embodiments of the present disclosure.

FIG. 2B is a cross-section of a semiconductor device, in accordance with some embodiments of the present disclosure.

The semiconductor device shown in FIG. 2B includes a device C1' and a device C2. The devices C1' and C2 can each be an electronic device. The devices C1' and C2 can each be an IC. The device C1' shown in FIG. 2B is similar to the device C1 shown in FIG. 2A, the difference lies in that the device C1' further includes a protection layer 10*p* in contact with the conductive element 10*v*. The protection layer 10*p* can cover/surround the conductive element 10*v*. The protection layer 10*p* can be an electrical insulation layer. The protection layer 10*p* can isolate the conductive element 10*v* from any circuit/device adjacent to the conductive element 10*v*.

A space e3 exists between the device 100 and the conductive element 10*v*. A space e4 exists between conductive element 10*v* and a semiconductor device (not shown) adjacent to the conductive element 10*v*. Non-functional circuits can be located within the space e3 or e4. Dummy patterns can be formed within the space e3 or e4. In some embodiments, one or more semiconductor components, such as a boundary cell, a dummy oxide diffusion structure, a dummy polysilicon structure, a decoupling capacitor, a metal capacitor, or a tap well, can be located within the space e3 or e4.

The semiconductor components disposed within the space e3 or e4 can be those providing performance benefits to the overall system, without adversely affecting function of the overall system if damaged.

For example, a decoupling capacitor can be disposed within the space e3 or e4. A decoupling capacitor can keep voltage stable, and several decoupling capacitors can be included within the overall system. As a result, the overall system can continue operations even if some decoupling capacitors located within the space e3 or e4 are damaged during the formation of the conductive element 10*v*.

For example, a tap well can be disposed within the space e3 or e4. Well tap cells (or Tap cells, tap wells) are used to prevent latch-up in the CMOS design. A tap cell can connect the nwell to the positive supply voltage (VDD) to prevent latch-up. A tap cell can connect the p-substrate to the negative supply voltage (VSS) to prevent latch-up. In general, a plurality of tap cells can be disposed within an electronic device. As a result, the overall system can continue operations even if some tap cells located within the space e3 or e4 are damaged during the formation of the conductive element 10*v*.

Figure 2C:
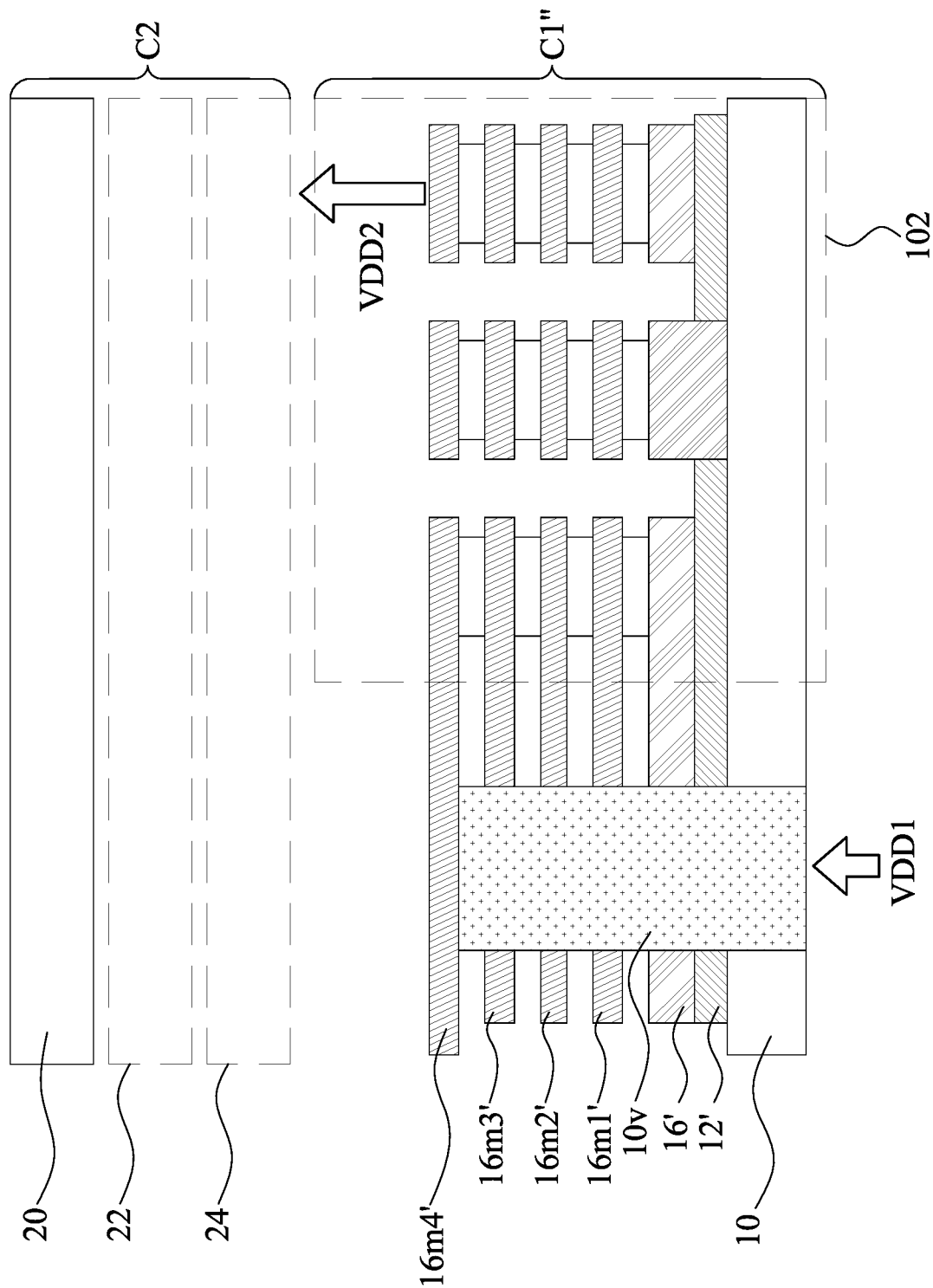
FIG. 2C is a cross-section of a semiconductor device, in accordance with some embodiments of the present disclosure.

FIG. 2C is a cross-section of a semiconductor device, in accordance with some embodiments of the present disclosure.

The semiconductor device shown in FIG. 2C includes a device C1" and a device C2. The devices C1" and C2 can each be an electronic device. The devices C1" and C2 can each be an IC. The device C1" includes a device 102. The device 102 can be a transistor. The device 102 can be a header cell.

The device C1" shown in FIG. 2C is similar to the device C1 shown in FIG. 2A, the difference lies in that in addition to the topmost metal layer 16*m*4', the conductive element 10*v* is further electrically connected to the metal layers 16*m*1', 16*m*2' and 16*m*3'. Furthermore, the conductive element 10*v* is electrically connected to the electrode 16' and the active layer 12'. With these additional electrical connections, resistance between conductive element 10*v* and the device 102 can be reduced.

Figure 3B:
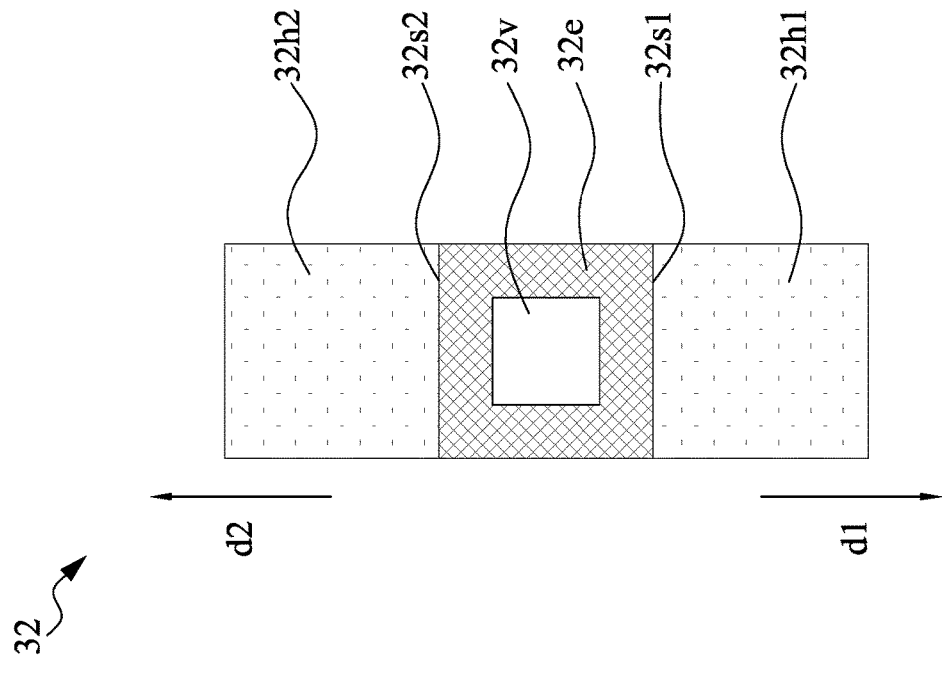
FIG. 3B is a top view of a layout of a semiconductor device, in accordance with some embodiments of the present disclosure.
Figure 3A:
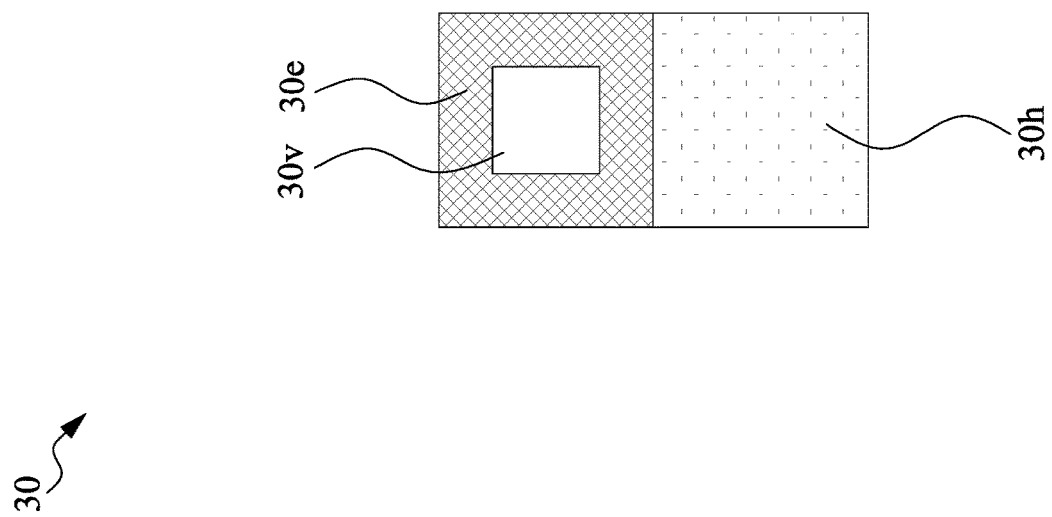
FIG. 3A is a top view of a layout of a semiconductor device, in accordance with some embodiments of the present disclosure.

FIG. 3A is a top view of a layout of a semiconductor device, in accordance with some embodiments of the present disclosure.

FIG. 3A shows a layout 30. The layout 30 can be a top view of a semiconductor. The layout 30 includes regions for a conductive element 30*v*, empty space 30*e*, and a header cell 30*h*. The empty space 30*e* surrounds the conductive element 30*v*. In some embodiments, the region for the conductive element 30*v* can be centered in the region for the empty space 30*e*. In some embodiments, the region for the conductive element 30*v* may not be centered in the region for the empty space 30*e*. The header cell 30*h* can be disposed adjacent to one side of the conductive element 30*v*.

FIG. 3B is a top view of a layout of a semiconductor device, in accordance with some embodiments of the present disclosure.

FIG. 3B shows a layout 32. The layout 32 can be a top view of a semiconductor. The layout 32 includes regions for a conductive element 32$v$, empty space 32$e$, and header cells 32$h$1 and 32$h$2. The empty space 32$e$ surrounds the conductive element 32$v$. In some embodiments, the region for the conductive element 32$v$ can be centered in the region for the empty space 32$e$. In some embodiments, the region for the conductive element 32$v$ may not be centered in the region for the empty space 32$e$.

The header cell 32$h$1 can be disposed adjacent to a side 32$s$1 of the empty space 32$e$. The header cell 32$h$2 can be disposed adjacent to a side 32$s$2 of the empty space 32$e$. The header cells 32$h$1 and 32$h$2 can be disposed on opposite sides of the empty space 32$e$. The side 32$s$1 can face a direction d1, and the side 32$s$2 can face a direction d2. The direction d1 can be in parallel with the direction d2. The direction d1 can be opposite to the direction d2.

Figures 3C, 3D:
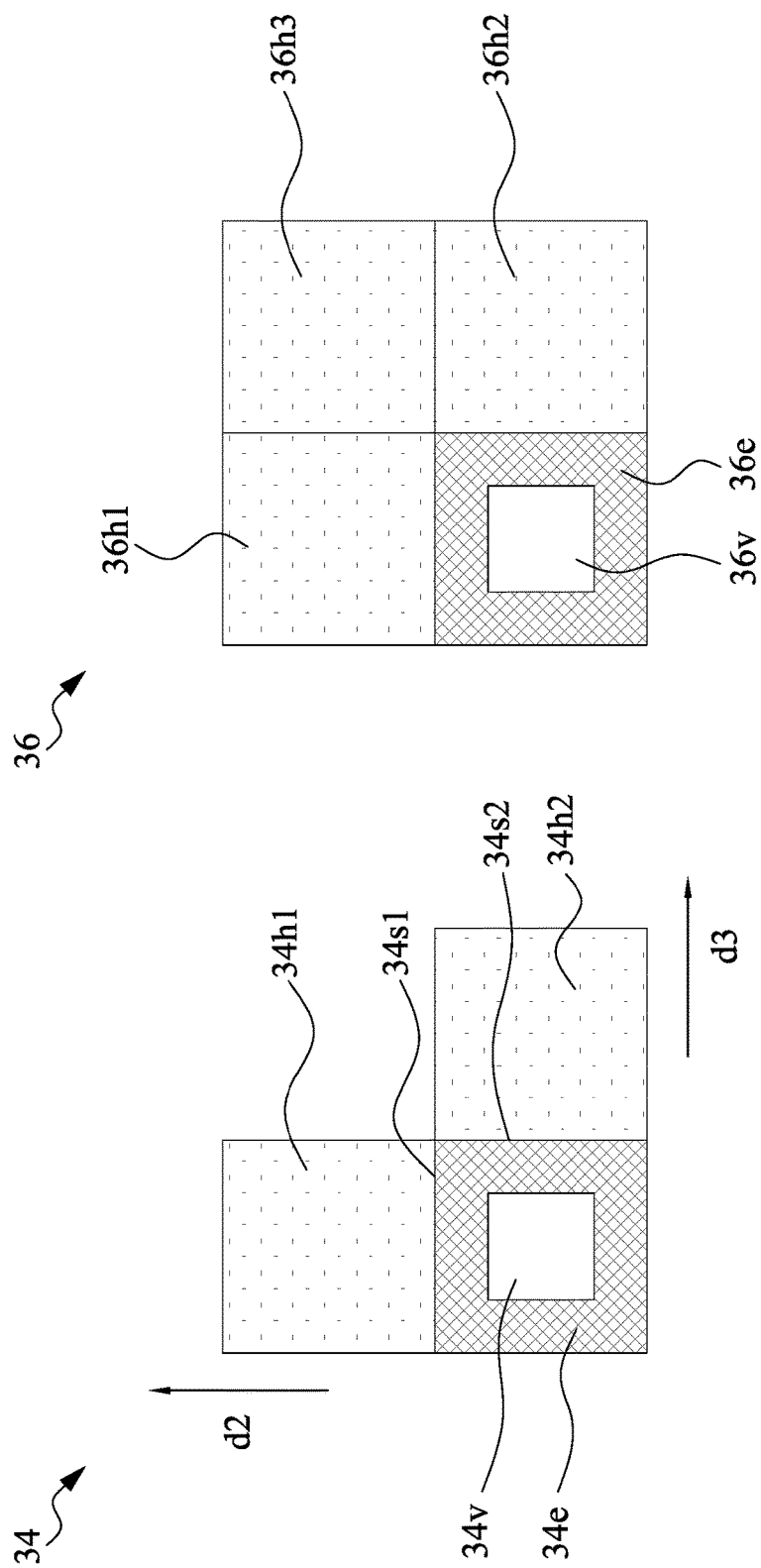
FIG. 3C is a top view of a layout of a semiconductor device, in accordance with some embodiments of the present disclosure.
FIG. 3D is a top view of a layout of a semiconductor device, in accordance with some embodiments of the present disclosure.

FIG. 3C is a top view of a layout of a semiconductor device, in accordance with some embodiments of the present disclosure.

FIG. 3C shows a layout 34. The layout 34 can be a top view of a semiconductor. The layout 34 includes regions for a conductive element 34$v$, empty space 34$e$, and header cells 34$h$1 and 34$h$2. The empty space 34$e$ surrounds the conductive element 34$v$. In some embodiments, the region for the conductive element 34$v$ can be centered in the region for the empty space 34$e$. In some embodiments, the region for the conductive element 34$v$ may not be centered in the region for the empty space 34$e$.

The header cell 34$h$1 can be disposed adjacent to a side 34$s$1 of the empty space 34$e$. The header cell 34$h$2 can be disposed adjacent to a side 34$s$2 of the empty space 34$e$. The side 34$s$1 can face a direction d2, and the side 34$s$2 can face a direction d3. The direction d2 can be different than the direction d3. The direction d2 can be perpendicular to the direction d3.

FIG. 3D is a top view of a layout of a semiconductor device, in accordance with some embodiments of the present disclosure.

FIG. 3D shows a layout 36. The layout 36 can be a top view of a semiconductor. The layout 36 includes regions for a conductive element 36$v$, empty space 36$e$, and header cells 36$h$1, 36$h$2 and 36$h$3. The empty space 36$e$ surrounds the conductive element 36$v$. In some embodiments, the region for the conductive element 36$v$ can be centered in the region for the empty space 36$e$. In some embodiments, the region for the conductive element 36$v$ may not be centered in the region for the empty space 36$e$.

The region for the header cell 36$h$3 can be adjacent to the region for the header cell 36$h$1. The region for the header cell 36$h$3 can be adjacent to the region for the header cell 36$h$2. The region for the header cell 36$h$3 can be in contact with the region for the header cell 36$h$1. The region for the header cell 36$h$3 can be in contact with the region for the header cell 36$h$2.

Figure 3E:
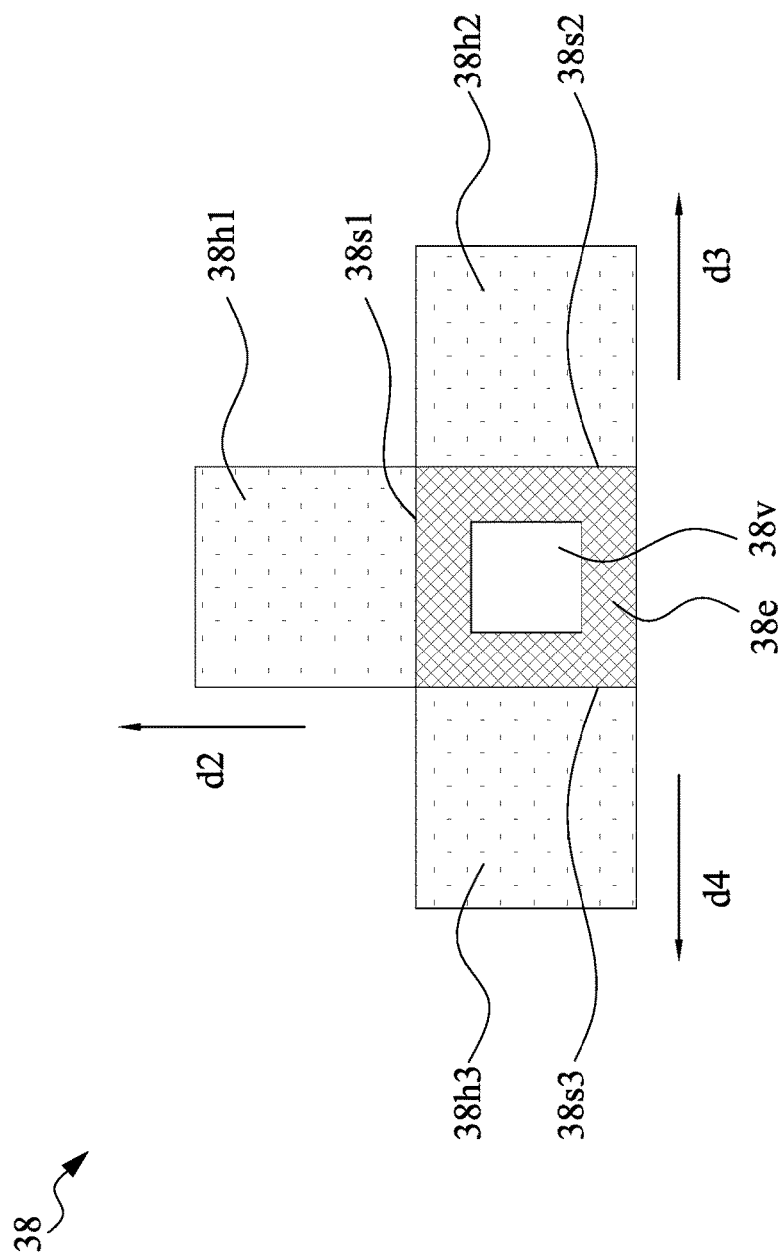
FIG. 3E is a top view of a layout of a semiconductor device, in accordance with some embodiments of the present disclosure.

FIG. 3E is a top view of a layout of a semiconductor device, in accordance with some embodiments of the present disclosure.

FIG. 3E shows a layout 38. The layout 38 can be a top view of a semiconductor. The layout 38 includes regions for a conductive element 38$v$, empty space 38$e$, and header cells 38$h$1, 38$h$2 and 38$h$3. The empty space 38$e$ surrounds the conductive element 38$v$. In some embodiments, the region for the conductive element 38$v$ can be centered in the region for the empty space 38$e$. In some embodiments, the region for the conductive element 38$v$ may not be centered in the region for the empty space 38$e$.

The header cell 38$h$1 can be disposed adjacent to a side 38$s$1 of the empty space 38$e$. The header cell 38$h$2 can be disposed adjacent to a side 38$s$2 of the empty space 38$e$. The header cell 38$h$3 can be disposed adjacent to a side 38$s$3 of the empty space 38$e$.

The side 38$s$1 can face a direction d2, the side 38$s$2 can face a direction d3, and the side 38$s$3 can face a direction d4. The direction d2 can be different than the direction d3. The direction d2 can be different than the direction d4. The direction d3 can be different than the direction d4.

The direction d2 can be perpendicular to the direction d3. The direction d2 can be perpendicular to the direction d4. The direction d3 can be parallel with the direction d4. The direction d3 can be opposite to the direction d4.

Figure 3F:
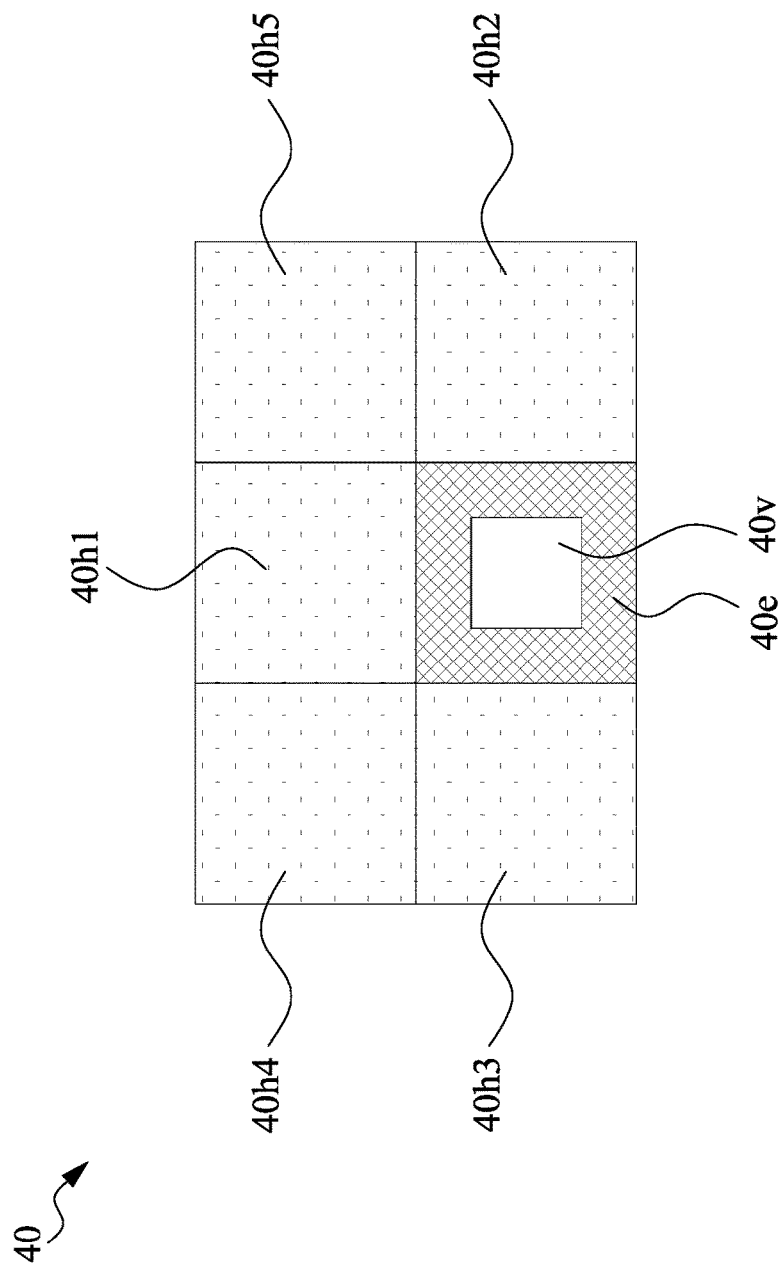
FIG. 3F is a top view of a layout of a semiconductor device, in accordance with some embodiments of the present disclosure.

FIG. 3F is a top view of a layout of a semiconductor device, in accordance with some embodiments of the present disclosure.

FIG. 3F shows a layout 40. The layout 40 can be a top view of a semiconductor. The layout 40 includes regions for a conductive element 40$v$, empty space 40$e$, and header cells 40$h$1, 40$h$2, 40$h$3, 40$h$4 and 40$h$5. The empty space 40$e$ surrounds the conductive element 40$v$. In some embodiments, the region for the conductive element 40$v$ can be centered in the region for the empty space 40$e$. In some embodiments, the region for the conductive element 40$v$ may not be centered in the region for the empty space 40$e$.

The region for the header cell 40$h$4 can be adjacent to the region for the header cell 40$h$1. The region for the header cell 40$h$4 can be adjacent to the region for the header cell 40$h$3. The region for the header cell 40$h$4 can be in contact with the region for the header cell 40$h$1. The region for the header cell 40$h$4 can be in contact with the region for the header cell 40$h$3.

The region for the header cell 40$h$5 can be adjacent to the region for the header cell 40$h$1. The region for the header cell 40$h$5 can be adjacent to the region for the header cell 40$h$2. The region for the header cell 40$h$5 can be in contact with the region for the header cell 40$h$1. The region for the header cell 40$h$5 can be in contact with the region for the header cell 40$h$2.

Figure 3G:
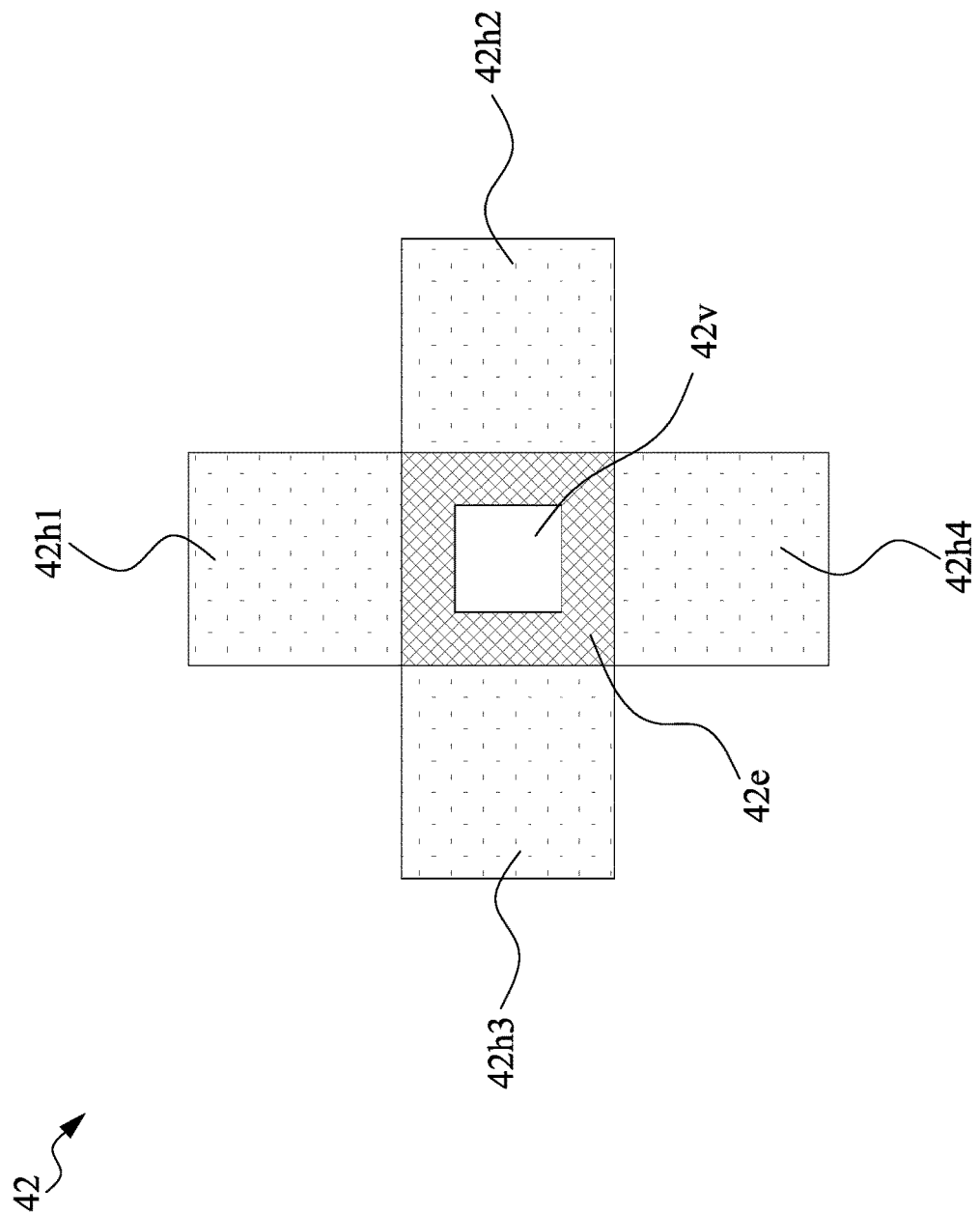
FIG. 3G is a top view of a layout of a semiconductor device, in accordance with some embodiments of the present disclosure.

FIG. 3G is a top view of a layout of a semiconductor device, in accordance with some embodiments of the present disclosure.

FIG. 3G shows a layout 42. The layout 42 can be a top view of a semiconductor. The layout 42 includes regions for a conductive element 42$v$, empty space 42$e$, and header cells 42$h$1, 42$h$2, 42$h$3, and 42$h$4. The empty space 42$e$ surrounds the conductive element 42$v$. In some embodiments, the region for the conductive element 42$v$ can be centered in the region for the empty space 42$e$. In some embodiments, the region for the conductive element 42$v$ may not be centered in the region for the empty space 42$e$.

The regions for the header cells 42$h$1 and 42$h$4 can be disposed on opposite sides of the region for the empty space 42$e$. The regions for the header cells 42$h$2 and 42$h$3 can be disposed on opposite sides of the region for the empty space 42$e$. The region for the empty space 42$e$ can be surrounded by the regions for the header cells 42$h$1, 42$h$2, 42$h$3, and 42$h$4. The header cells 42$h$1, 42$h$2, 42$h$3, and 42$h$4 can be electrically connected to the conductive element 42$v$. In some embodiments, the header cells 42$h$1, 42$h$2, 42$h$3, and 42$h$4 can be electrically connected to the conductive element 42$v$ through conductive layers, for example, as shown in FIG. 4E.

Figure 3H:
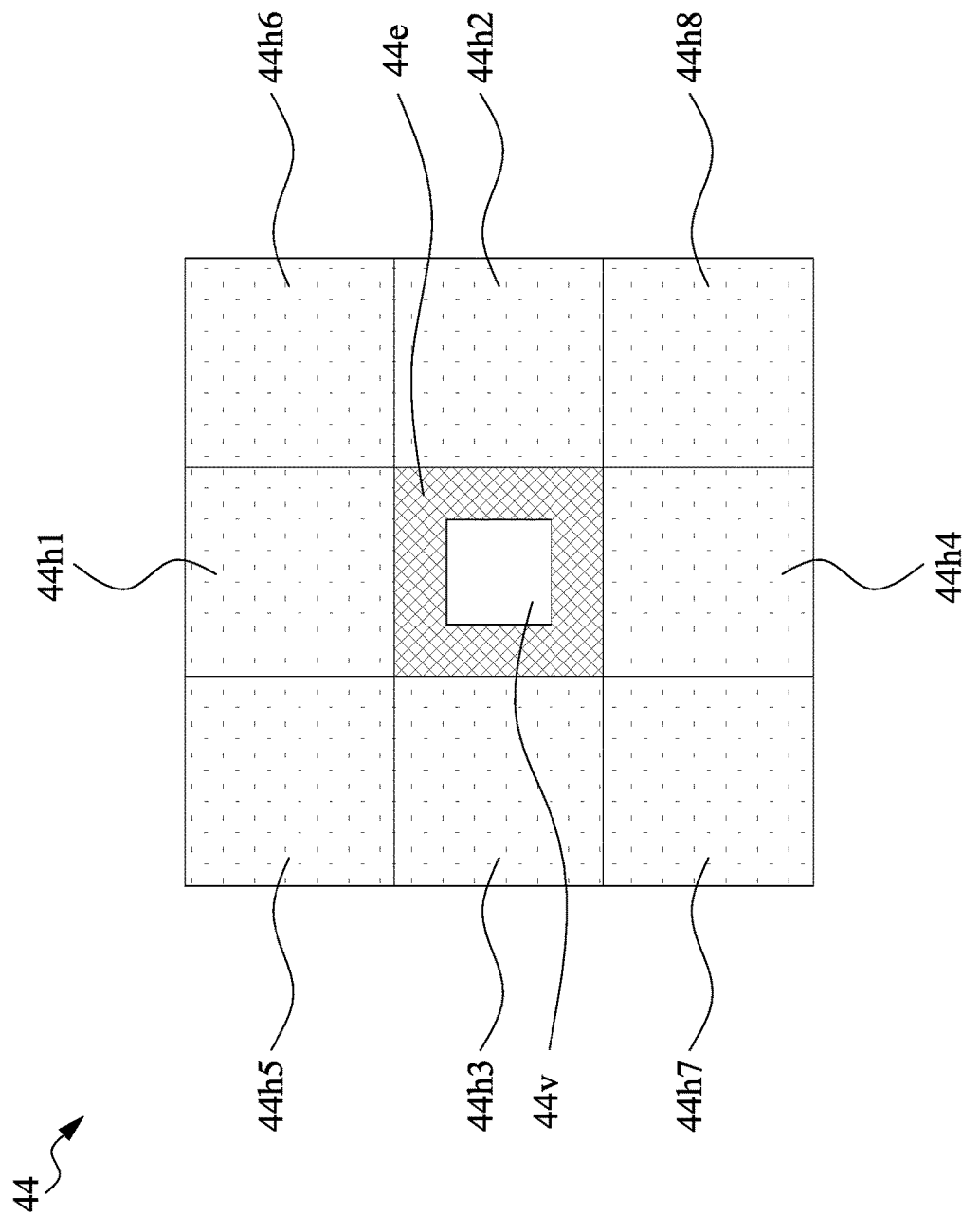
FIG. 3H is a top view of a layout of a semiconductor device, in accordance with some embodiments of the present disclosure.

FIG. 3H is a top view of a layout of a semiconductor device, in accordance with some embodiments of the present disclosure.

FIG. 3H shows a layout 44. The layout 44 can be a top view of a semiconductor. The layout 44 includes regions for a conductive element 44v, empty space 44e, and header cells 44h1, 44h2, 44h3, 44h4, 44h5, 44h6, 44h7 and 44h8. The empty space 44e surrounds the conductive element 44v.

In some embodiments, the region for the conductive element 44v can be centered in the region for the empty space 44e. In some embodiments, the region for the conductive element 44v may not be centered in the region for the empty space 44e. The region for the empty space 44e can be surrounded by the regions for the header cells 44h1, 44h2, 44h3, 44h4, 44h5, 44h6, 44h7 and 44h8.

FIG. 4A is a top view of a layout of a semiconductor device, in accordance with some embodiments of the present disclosure.

FIG. 4A shows a layout 30'. The layout 30' can be a top view of a semiconductor. The layout 30' includes regions for a conductive element 30v, empty space 30e, and a header cell 30h. The layout 30' of FIG. 4A is similar to the layout 30 of FIG. 3A, the difference lies in that the layout 30' further includes one or more conductive layers.

In some embodiments, the layout 30' further includes conductive layers 30m1 and 30m2. The conductive layer 30m1 can be electrically connected to the conductive element 30v. The conductive layer 30m1 can be electrically connected between the conductive element 30v and the header cell 30h. The header cell 30h can be electrically connected to the conductive element 30v through the conductive layer 30m1. An electrode of the header cell 30h can be electrically connected to the conductive element 30v through the conductive layer 30m1.

The conductive layer 30m1 can extend from the region for the conductive element 30v to the region for the header cell 30h. The conductive layer 30m1 can extend from the region for the empty space 30e to the region for the header cell 30h. The conductive layer 30m1 can extend across a boundary (i.e., a side 30s of the empty space 30e) between the regions for the empty space 30e and the header cell 30h.

The conductive layer 30m2 can be located within the region for the header cell 30h. It should be noted that the conductive layers shown in FIG. 4A can each correspond to a topmost conductive layer of a semiconductor device. For example, the conductive layers shown in FIG. 4A can correspond to the conductive layers 16m4 or 18m4 of FIG. 1, or the conductive layer 16m4' of FIGS. 2A-2C.

FIG. 4B is a top view of a layout of a semiconductor device, in accordance with some embodiments of the present disclosure.

FIG. 4B shows a layout 32'. The layout 32' can be a top view of a semiconductor. The layout 32' includes regions for a conductive element 32v, empty space 32e, and header cells 32h1 and 32h2. The layout 32' of FIG. 4B is similar to the layout 32 of FIG. 3B, the difference lies in that the layout 32' further includes one or more conductive layers.

In some embodiments, the layout 32' further includes conductive layers 32m1, 32m2, 32m3, 32m4 and 32m5. The conductive layer 32m1 can be isolated from the conductive element 32v. The conductive layer 32m2 can be electrically connected to the conductive element 32v. The conductive layer 32m5 can be electrically connected to the conductive element 32v.

The conductive layer 32m2 can be electrically connected to the header cell 32h1. The conductive layer 32m2 can be electrically connected to the header cell 32h2. The conductive layer 32m5 can be electrically connected to the header cell 32h1. The conductive layer 32m5 can be electrically connected to the header cell 32h2. The header cell 32h1 can be electrically connected to the conductive element 32v through one of the conductive layers 32m2 and 32m5, while the header cell 32h2 can be electrically connected to the conductive element 32v through the other one of the conductive layers 32m2 and 32m5.

The conductive layer 30m1 can extend from the region for the header cell 32h1 to the region for the header cell 32h2. The conductive layer 32m1 can extend across a boundary (i.e., a side 32s1 of the empty space 32e) between the regions for the empty space 32e and the header cell 32h1. The conductive layer 32m1 can extend across a boundary (i.e., a side 32s2 of the empty space 32e) between the regions for the empty space 32e and the header cell 32h2.

The conductive layers 30m2 and 32m5 can extend from the region for the header cell 32h1 to the region for the header cell 32h2. The conductive layers 30m2 and 32m5 can extend across a boundary (i.e., a side 32s1 of the empty space 32e) between the regions for the empty space 32e and the header cell 32h1. The conductive layers 30m2 and 32m5 can extend across a boundary (i.e., a side 32s2 of the empty space 32e) between the regions for the empty space 32e and the header cell 32h2.

The conductive layer 32m3 can be located within the region for the header cell 32h2. The conductive layer 32m4 can be located within the region for the empty space 32e. The conductive layers shown in FIG. 4B can each correspond to a topmost conductive layer of a semiconductor device.

Figure 4C:
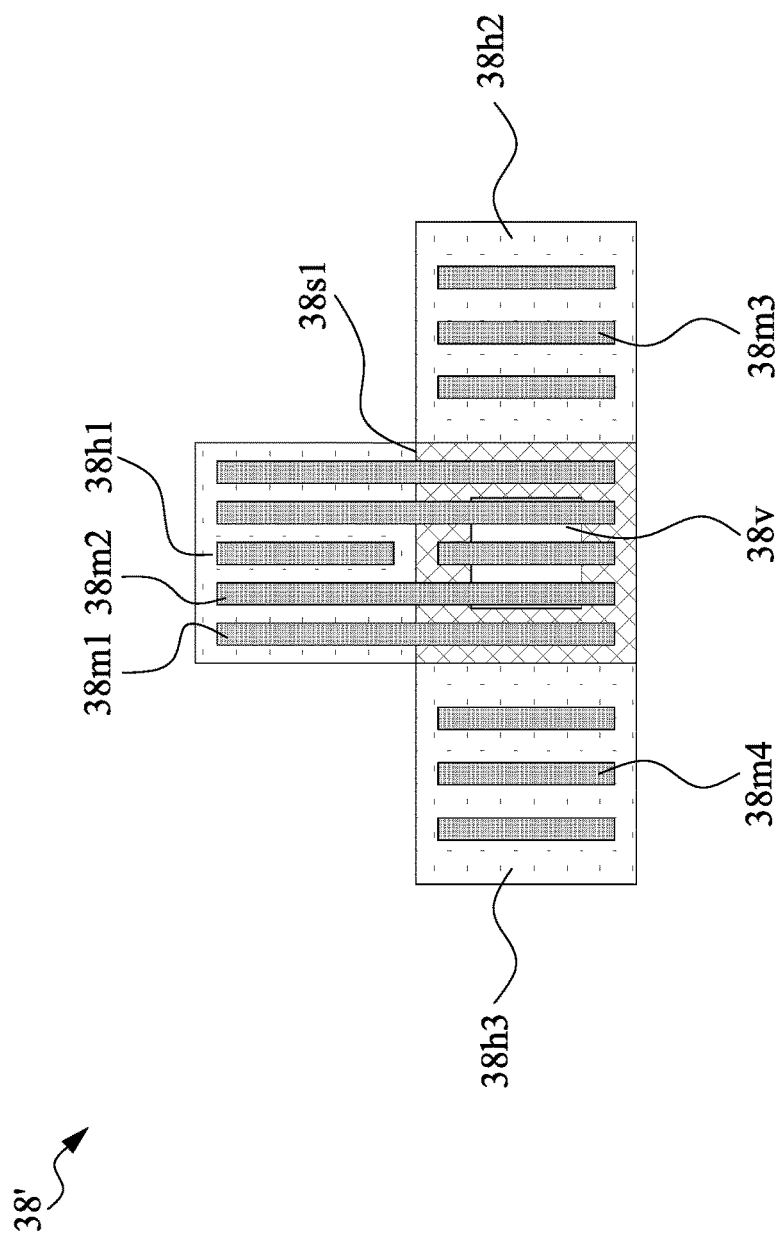
FIG. 4C is a top view of a layout of a semiconductor device, in accordance with some embodiments of the present disclosure.

FIG. 4C is a top view of a layout of a semiconductor device, in accordance with some embodiments of the present disclosure.

FIG. 4C shows a layout 38'. The layout 38' can be a top view of a semiconductor. The layout 38' includes regions for a conductive element 38v, empty space 38e, and header cells 38h1, 38h2 and 38h3. The layout 38' of FIG. 4C is similar to the layout 38 of FIG. 3E, the difference lies in that the layout 38' further includes one or more conductive layers.

In some embodiments, the layout 38' further includes conductive layers 38m1, 38m2, 38m3 and 38m4. The conductive layer 38m1 can be isolated from the conductive element 38v. The conductive layer 38m2 can be electrically connected to the conductive element 38v. The header cell 38h1 can be electrically connected to the conductive element 38v through the conductive layer 38m2.

The conductive layers 38m1 and 38m2 can extend from the region for the conductive element 38v to the region for the header cell 38h1. The conductive layers 38m1 and 38m2 can extend from the region for the empty space 38e to the region for the header cell 38h1. The conductive layers 38m1 and 38m2 can extend across a boundary (i.e., a side 38s1 of the empty space 38e) between the regions for the empty space 38e and the header cell 38h1.

Although not shown in FIG. 4C, the conductive layers 38m3 and 38m4 can also be electrically connected to the conductive element 38v. The header cell 38h2 can be electrically connected to the conductive element 38v through the conductive layer 38m3 and several conductive layers (not shown) underneath the conductive layer 38m3. The header cell 38h3 can be electrically connected to the conductive element 38v through the conductive layer 38m4 and several conductive layers (not shown) underneath the conductive layer 38m4.

Figure 4D:
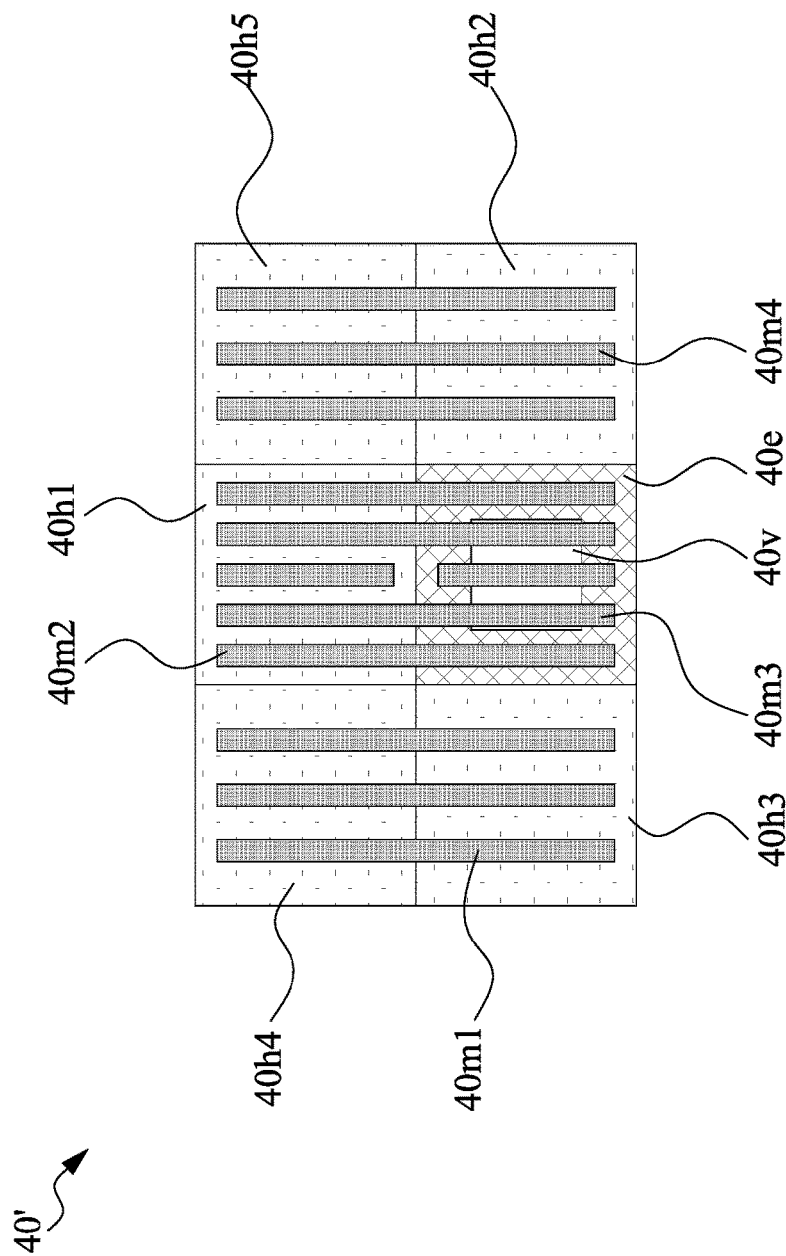
FIG. 4D is a top view of a layout of a semiconductor device, in accordance with some embodiments of the present disclosure.
Figure 4E:
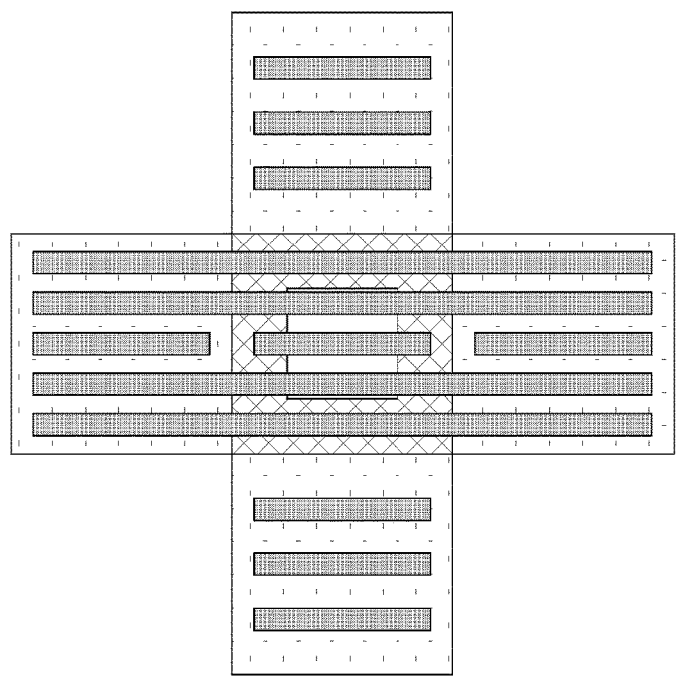
FIG. 4E is a top view of a layout of a semiconductor device, in accordance with some embodiments of the present disclosure.

FIG. 4D is a top view of a layout of a semiconductor device, in accordance with some embodiments of the present disclosure.

FIG. 4D shows a layout 40'. The layout 40' can be a top view of a semiconductor. The layout 40' includes regions for a conductive element 40v, empty space 40e, and header cells 40h1, 40h2, 40h3, 40h4 and 40h5. The layout 40' of FIG. 4D is similar to the layout 40 of FIG. 3F, the difference lies in that the layout 40' further includes one or more conductive layers.

In some embodiments, the layout 40' further includes conductive layers 40m1, 40m2, 40m3 and 40m4. The conductive layer 40m2 can be isolated from the conductive element 40v. The conductive layer 40m3 can be electrically connected to the conductive element 40v. The header cell 40h1 can be electrically connected to the conductive element 40v through the conductive layer 40m3.

Although not shown in FIG. 4D, the conductive layers 40m1 and 40m4 can also be electrically connected to the conductive element 40v. The header cells 40h3 or 40h4 can be electrically connected to the conductive element 40v through the conductive layer 40m1 and several conductive layers (not shown) underneath the conductive layer 40m1. The header cells 40h2 or 40h5 can be electrically connected to the conductive element 40v through the conductive layer 40m4 and several conductive layers (not shown) underneath the conductive layer 40m4.

FIG. 4E is a top view of a layout of a semiconductor device, in accordance with some embodiments of the present disclosure. FIG. 4E shows a layout 42'. The layout 42' can be a top view of a semiconductor. The layout 42' can be detailed similar to the description of FIGS. 4A-4D.

Figure 4F:
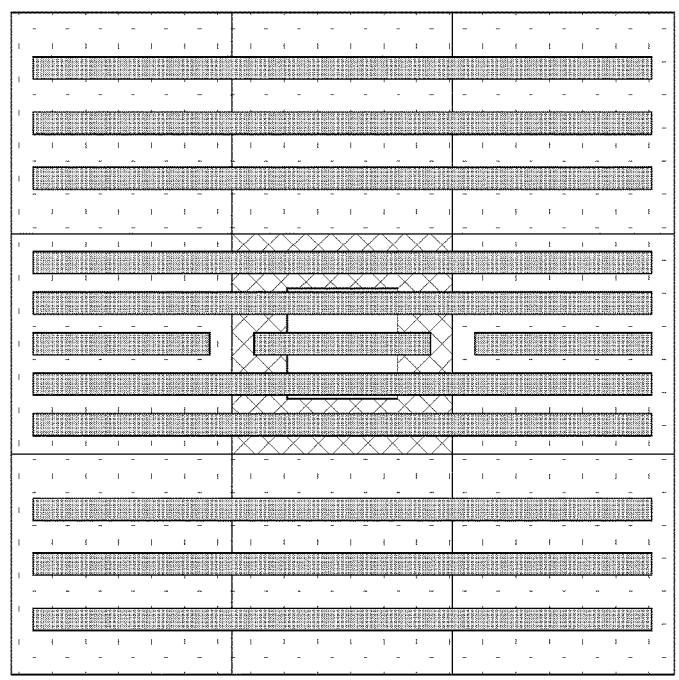
FIG. 4F is a top view of a layout of a semiconductor device, in accordance with some embodiments of the present disclosure.

FIG. 4F is a top view of a layout of a semiconductor device, in accordance with some embodiments of the present disclosure. FIG. 4F shows a layout 44'. The layout 44' can be a top view of a semiconductor. The layout 44' can be detailed similar to the description of FIGS. 4A-4D.

FIG. 5A is a top view of a layout of a semiconductor device, in accordance with some embodiments of the present disclosure.

FIG. 5A shows a layout 50. The layout 50 can be a top view of a semiconductor. The layout 50 includes regions for a conductive element 50v, empty space 50e, and a header cell 50h. The layout 50 of FIG. 5A is similar to the layout 30 of FIG. 3A, the difference lies in that the layout 50 further includes a region for a boundary cell 50b. The boundary cell 50b occupies a portion of the region for the header cell 50h.

A boundary cell is a physical-only cell with no logical function. The boundary cells protect the device from external disturbance. The boundary cell 50b can protect the header cell 50h from external disturbance.

The region for the empty space 50e has outer dimensions L×L. The region for the header cell 50h has outer dimensions L×M. In some embodiments, the outer dimension L can be substantially identical to the outer dimension M. In some embodiments, the outer dimension L can be different than the outer dimension M. The region for the empty space 50e has a thickness W1. The thickness W1 can be a distance between the conductive element 50v and an edge of the region for the empty space 50e. The region for the boundary cell 50b has a thickness W2. In some embodiments, the thickness W1 can be substantially identical to the thickness W2. In some embodiments, the thickness W1 can be different than the thickness W2.

The total area A1 of the header cell 50h equals L×M. Since the boundary cell 50b is for protection purposes without logic function, the effective area of the header cell 50h equals (M−2W2)×(L−2W2).

A ratio R1 between the total area A1 and the effective area of the header cell 50h can be obtained in accordance with the following equation:

$$R1 = \frac{(M-2W2) \times (L-2W2)}{L \times M} \quad \text{(Equation 1)}$$

FIG. 5B is a top view of a layout of a semiconductor device, in accordance with some embodiments of the present disclosure.

FIG. 5B shows a layout 52. The layout 52 includes regions for a conductive element 52v, empty space 52e, and header cells 52h1 and 52h2. The region for the empty space 52e has outer dimensions L×L. The regions for the header cells 52h1 and 52h2 each have outer dimensions L×M.

The total area A2 of the headers cells 52h1 and 52h2 equals 2×(L×M). Since the boundary cells 52b1 and 52b2 are for protection purposes without logic function, the effective area of the header cells 52h1 and 52h2 equals 2×(M−2W2)×(L−2W2). A ratio between the total area A2 and the effective area of the header cells 52h1 and 52h2 can be obtained in accordance with Equation 1.

Figures 5C, 5D:
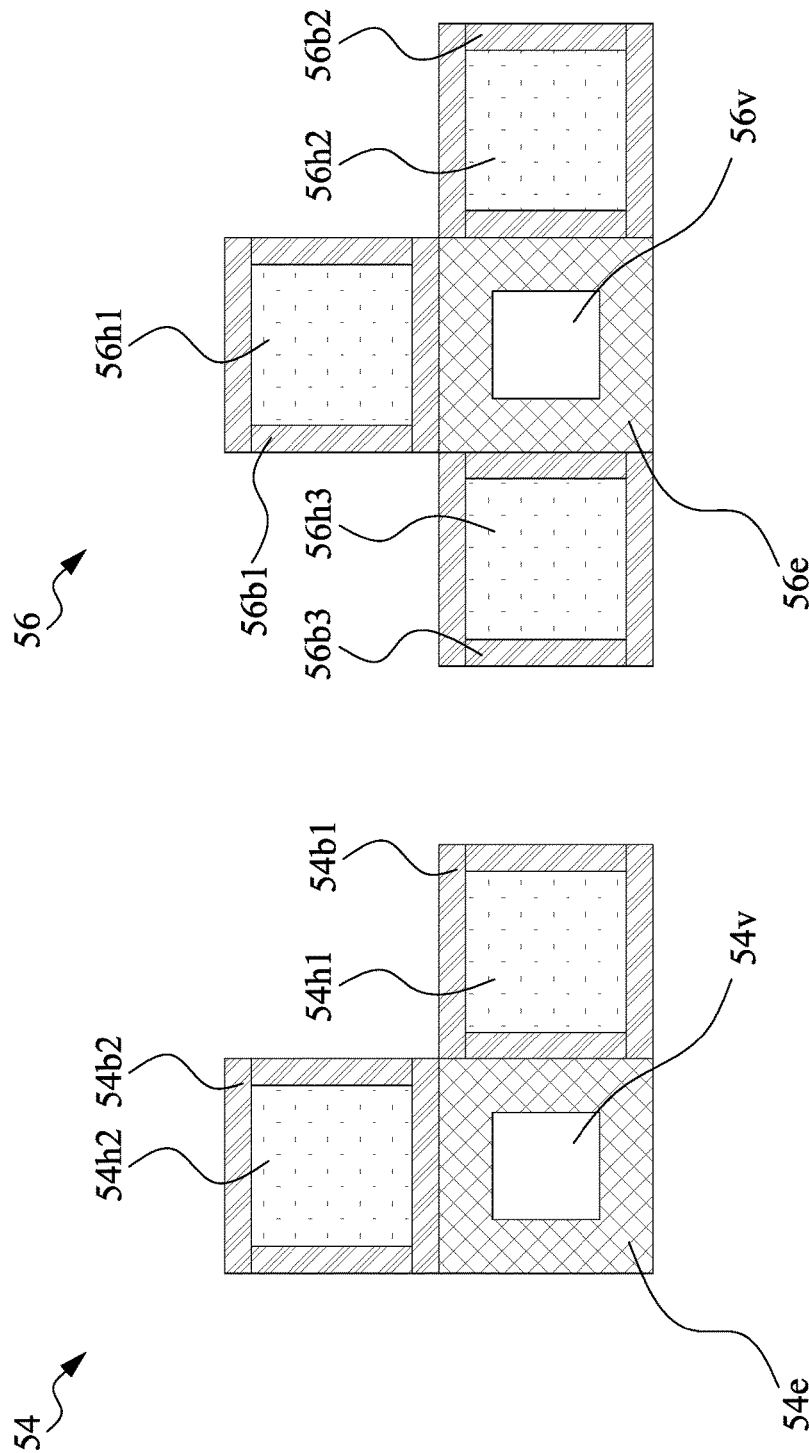
FIG. 5C is a top view of a layout of a semiconductor device, in accordance with some embodiments of the present disclosure.
FIG. 5D is a top view of a layout of a semiconductor device, in accordance with some embodiments of the present disclosure.

FIG. 5C is a top view of a layout of a semiconductor device, in accordance with some embodiments of the present disclosure. FIG. 5C shows a layout 54. The layout 54 includes regions for a conductive element 54v, empty space 54e, header cells 54h1 and 54h2, and boundary cells 54b1 and 54b2. The total area A3 of the headers cells 54h1 and 54h2 equals 2×(L×M). The effective area of the header cells 54h1 and 54h2 equals 2×(M−2W2)×(L−2W2). A ratio between the total area A3 and the effective area of the header cells 54h1 and 54h2 can be obtained in accordance with the Equation 1.

FIG. 5D is a top view of a layout of a semiconductor device, in accordance with some embodiments of the present disclosure. FIG. 5D shows a layout 56. The layout 56 includes regions for a conductive element 56v, empty space 56e, header cells 56h1, 56h2 and 56h3, and boundary cells 56b1, 56b2 and 56b3. The total area A4 of the headers cells 56h1, 56h2 and 56h3 equals 3×(L×M). The effective area of the header cells 56h1, 56h2 and 56h3 equals 3×(M−2W2)×(L−2W2). A ratio between the total area A4 and the effective area of the header cells 56h1, 56h2 and 56h3 can be obtained in accordance with the Equation 1.

Figure 5E:
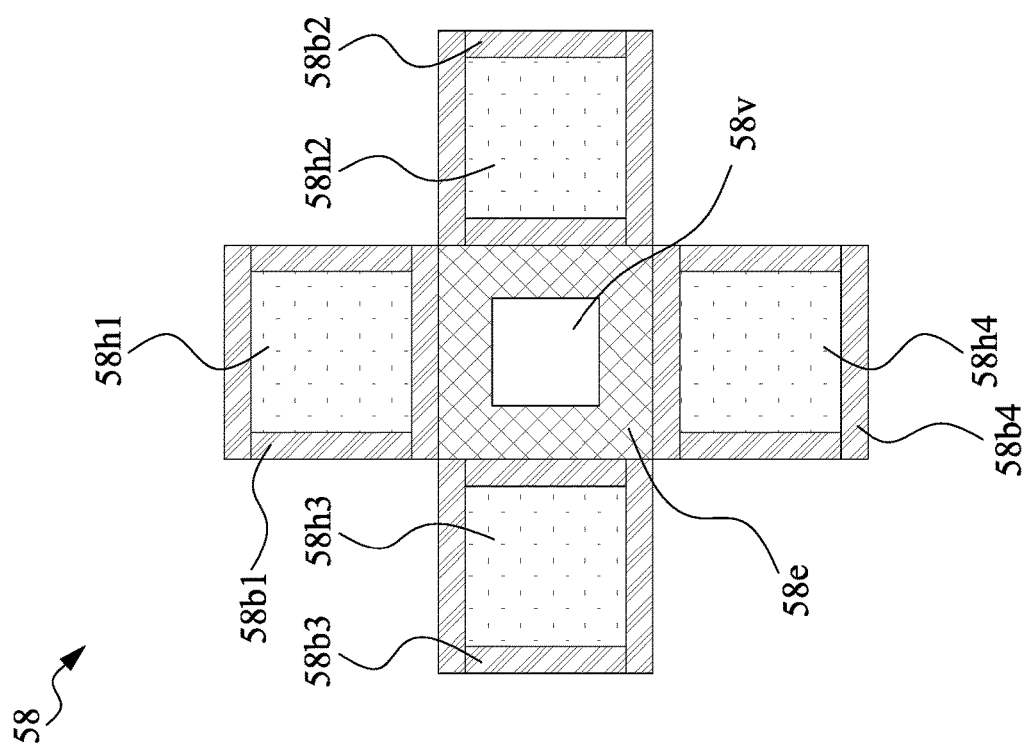
FIG. 5E is a top view of a layout of a semiconductor device, in accordance with some embodiments of the present disclosure.

FIG. 5E is a top view of a layout of a semiconductor device, in accordance with some embodiments of the present disclosure. FIG. 5E shows a layout 58. The layout 58 includes regions for a conductive element 58v, empty space 58e, header cells 58h1, 58h2, 58h3 and 58h4, and boundary cells 58b1, 58b2, 58b3 and 58b4. The total area A5 of the headers cells 58h1, 58h2, 58h3 and 58h4 equals 4×(L×M). The effective area of the header cells 58h1, 58h2, 58h3 and 58h4 equals 4×(M−2W2)×(L−2W2). A ratio between the total area A5 and the effective area of the header cells 58h1, 58h2, 58h3 and 58h4 can be obtained in accordance with the Equation 1.

Figure 5F:
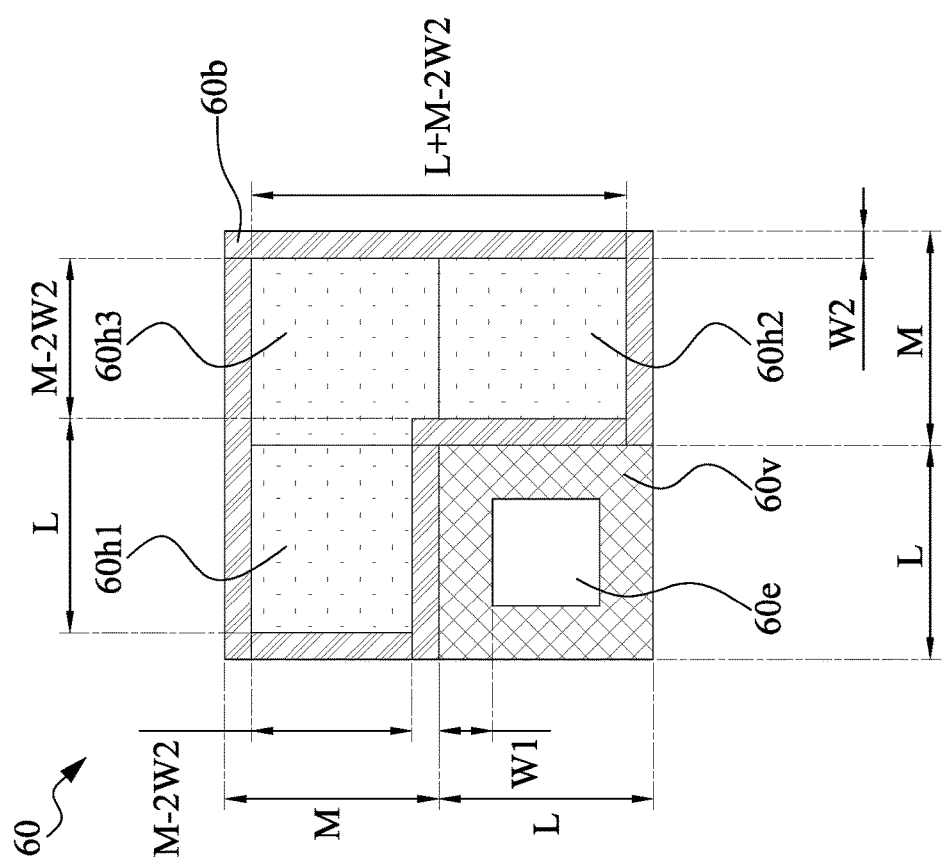
FIG. 5F is a top view of a layout of a semiconductor device, in accordance with some embodiments of the present disclosure.

FIG. 5F is a top view of a layout of a semiconductor device, in accordance with some embodiments of the present disclosure.

FIG. 5F shows a layout 60. The layout 60 includes regions for a conductive element 60v, empty space 60e, header cells 60h1, 60h2 and 60h3, and a boundary cell 60b. The boundary cell 60b surrounds the header cells 60h1, 60h2 and 60h3. The boundary cell 60b has a thickness W2.

The total area B of the headers cells 60h1, 60h2 and 60h3 equals $(L+M)^2-L^2$. The effective area of the header cells 60h1, 60h2 and 60h3 equals (L+M−2W2)×(M−2W2)+(M−2W2)×L.

A ratio R2 between the total area B and the effective area of the header cells 60h1, 60h2 and 60h3 can be obtained in accordance with the following equation:

$$R2 = \frac{(L+M-2W2) \times (M-2W2) + (M-2W) \times L}{(L+M)^2 - L^2} \quad \text{(Equation 2)}$$

Figure 5G:
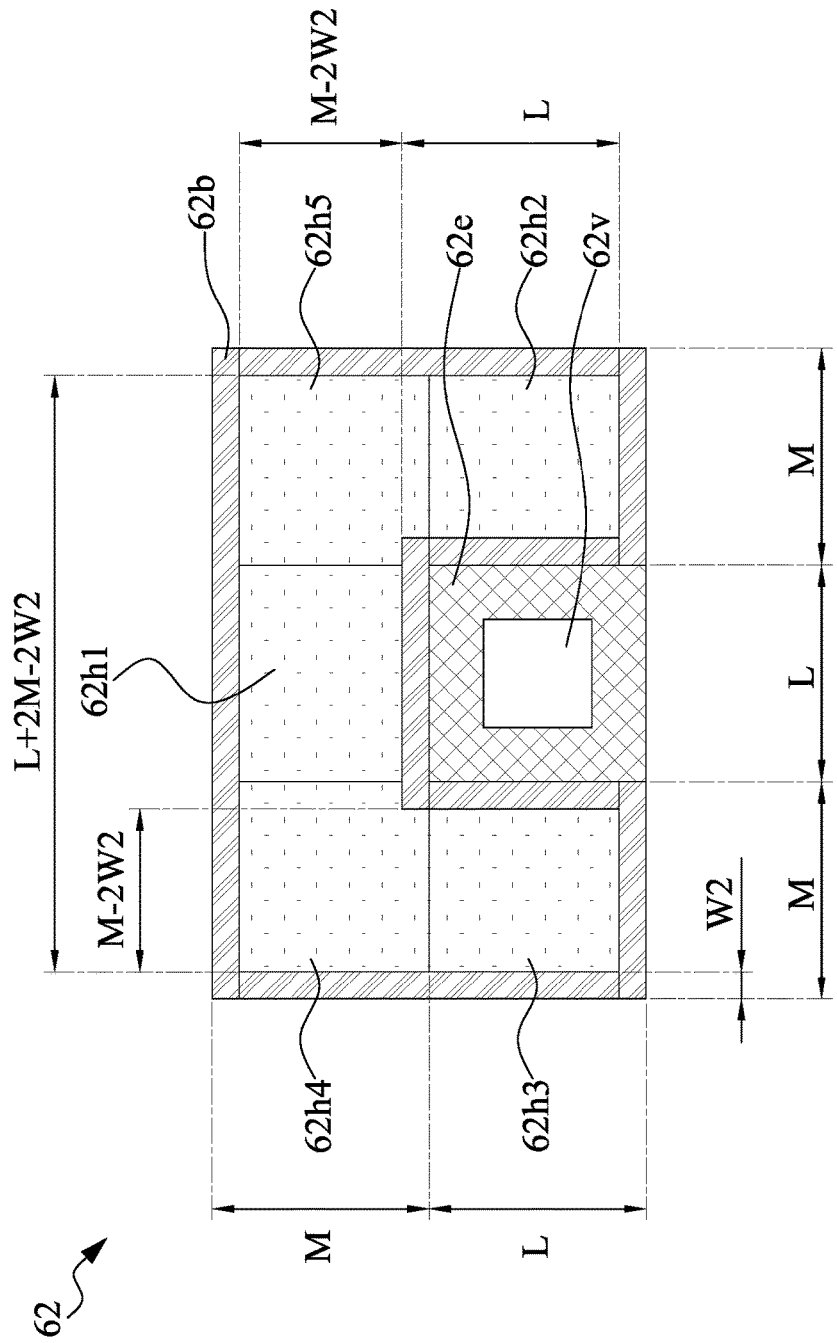
FIG. 5G is a top view of a layout of a semiconductor device, in accordance with some embodiments of the present disclosure.

FIG. 5G is a top view of a layout of a semiconductor device, in accordance with some embodiments of the present disclosure.

FIG. 5G shows a layout 62. The layout 62 includes regions for a conductive element 62v, empty space 62e, header cells 62h1, 62h2, 62h3, 62h4 and 62h5, and a boundary cell 62b. The boundary cell 62b surrounds the header cells 62h1, 62h2, 62h3, 62h4 and 62h5. The boundary cell 62b has a thickness W2.

The total area C of the headers cells 62h1, 62h2, 62h3, 62h4 and 62h5 equals $(L+2M) \times (L+M)-L^2$. The effective area of the header cells 62h1, 62h2, 62h3, 62h4 and 62h5 equals (L+2M−2W2)×(M−2W2)+2×(M−2W2)×L.

A ratio R3 between the total area C and the effective area of the header cells 62h1, 62h2, 62h3, 62h4 and 62h5 can be obtained in accordance with the following equation:

$$R3 = \frac{(L+2M-2W2) \times (M-2W2) + 2 \times (M-2W2) \times L}{(L+2M) \times (L+M) - L^2} \quad \text{(Equation 3)}$$

Figure 5H:
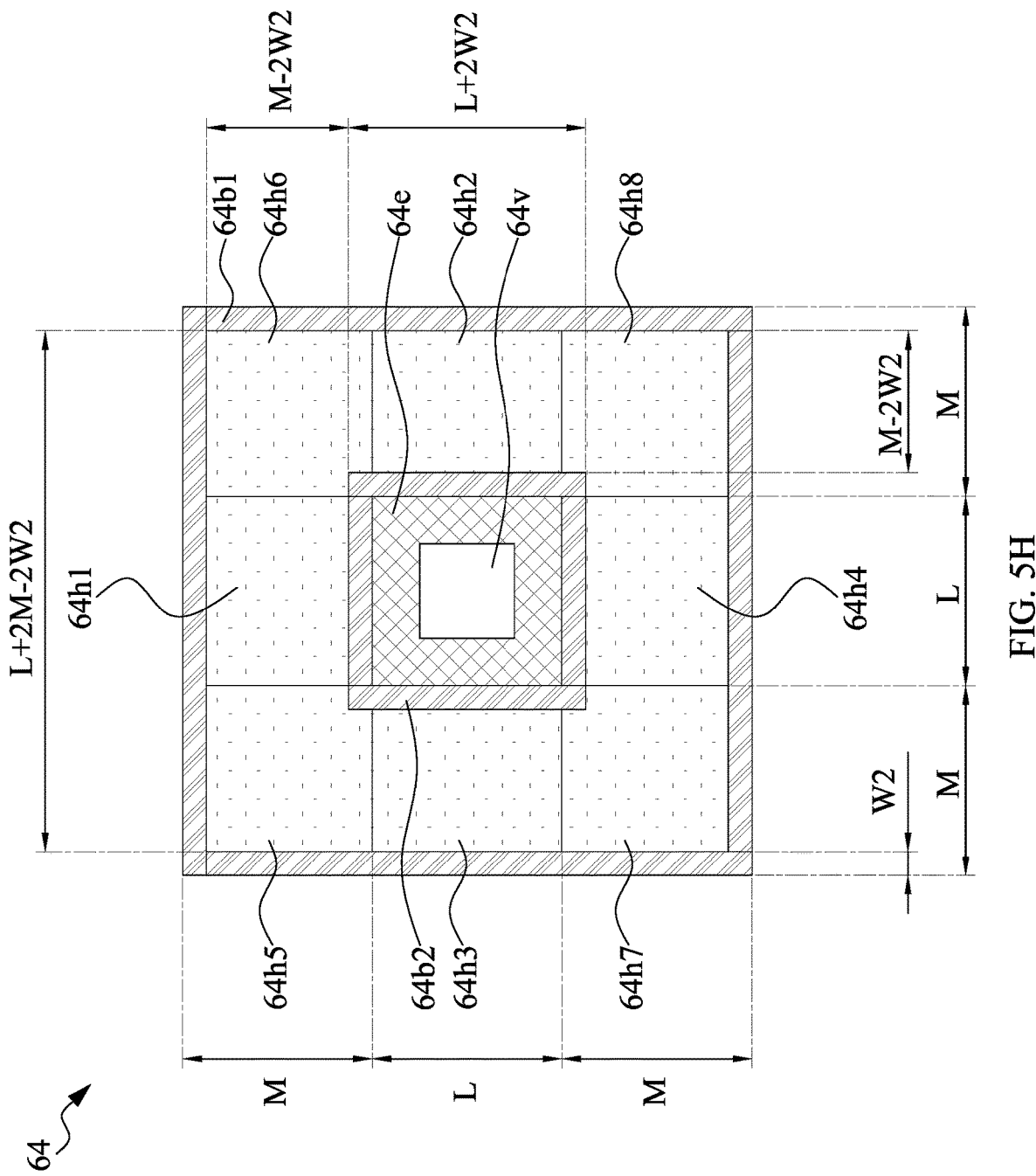
FIG. 5H is a top view of a layout of a semiconductor device, in accordance with some embodiments of the present disclosure.

FIG. 5H is a top view of a layout of a semiconductor device, in accordance with some embodiments of the present disclosure.

FIG. 5H shows a layout 64. The layout 64 includes regions for a conductive element 64v, empty space 64e, header cells 64h1, 64h2, 64h3, 64h4, 64h5, 64h6, 64h7 and 64h8, and boundary cells 64b1 and 64b2. The boundary cell 64b1 surrounds the header cells 64h1, 64h2, 64h3, 64h4, 64h5, 64h6, 64h7 and 64h8. The boundary cell 64b2 surrounds the empty space 64e. The boundary cell 64b1 and 64b2 each has a thickness W2.

The total area D of the headers cells 64h1, 64h2, 64h3, 64h4, 64h5, 64h6, 64h7 and 64h8 equals $(L+2M)^2-L^2$. The effective area of the header cells 62h1, 62h2, 62h3, 62h4 and 62h5 equals 2×(L+2M−2W2)×(M−2W2)+2×(M−2W2)×(L+2W2).

A ratio R4 between the total area D and the effective area of the header cells 64h1, 64h2, 64h3, 64h4, 64h5, 64h6, 64h7 and 64h8 can be obtained in accordance with the following equation:

$$R4 = \frac{\begin{array}{c}2 \times (L+2M-2W2) \times (M-2W2) + \\ 2 \times (M-2W2) \times (L+2W2)\end{array}}{(L+2M)^2 - L^2} \quad \text{(Equation 4)}$$

The layouts 50, 52, 54, 56 and 58 have different total areas A1, A2, A3, A4 and A5, while their ratio R1 is identical. The layouts 60, 62, and 64 have different total areas B, C and D, and also different ratios R2, R3 and R4. In general, the ratio R4 is greater than the ratio R3, the ratio R3 is greater than the ratio R2, and the ratio R2 is greater than the ratio R1. Circuit designers can choose between the layouts 50, 52, 54, 56, 58, 60, 62, and 64 according to their design goals.

Figure 6B:
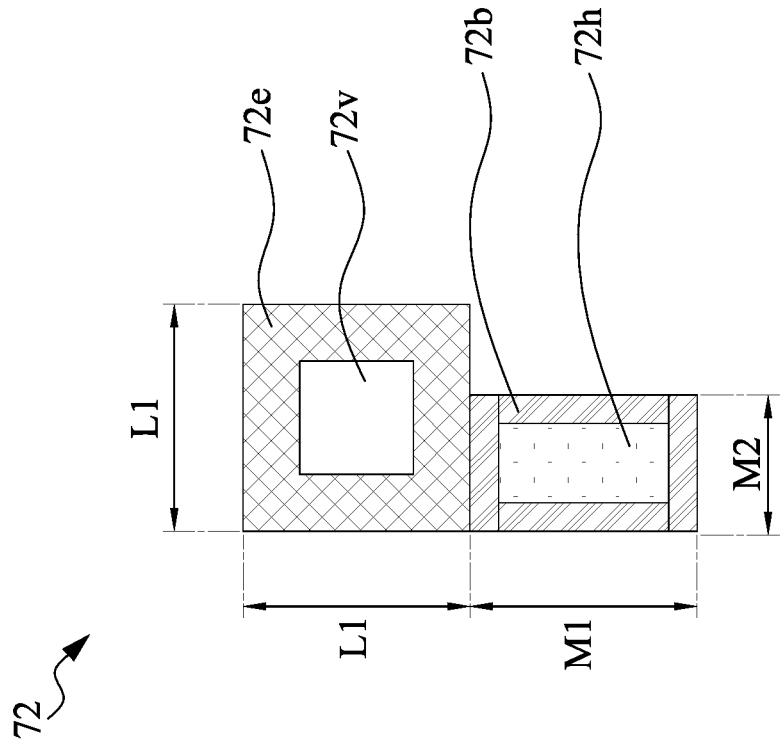
FIG. 6B is a top view of a layout of a semiconductor device, in accordance with some embodiments of the present disclosure.
Figure 6A:
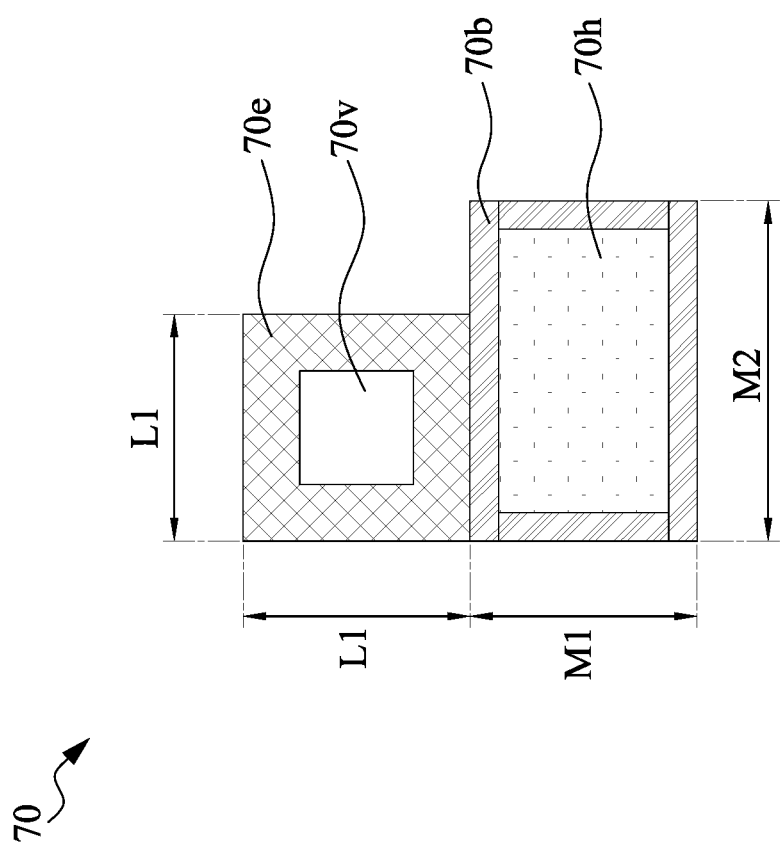
FIG. 6A is a top view of a layout of a semiconductor device, in accordance with some embodiments of the present disclosure.

FIG. 6A is a top view of a layout of a semiconductor device, in accordance with some embodiments of the present disclosure.

FIG. 6A shows a layout 70. The layout 70 can be a top view of a semiconductor. The layout 70 includes regions for a conductive element 70v, empty space 70e, a header cell 70h, and a boundary cell 70b.

The region for the empty space 70e has outer dimensions L1×L1. The region for the header cell 70h has outer dimensions M1×M2. In some embodiments, the outer dimension L1 can be substantially identical to the outer dimension M1. In some embodiments, the outer dimension L1 can be different than the outer dimension M1. The outer dimension M1 can be different than the outer dimension M2. The outer dimension M2 can be greater than the outer dimension M1. The outer dimension M2 can be greater than the outer dimension L1.

FIG. 6B is a top view of a layout of a semiconductor device, in accordance with some embodiments of the present disclosure.

FIG. 6B shows a layout 72. The layout 72 can be a top view of a semiconductor. The layout 72 includes regions for a conductive element 72v, empty space 72e, a header cell 72h, and a boundary cell 72b.

The region for the empty space 72e has outer dimensions L1×L1. The region for the header cell 72h has outer dimensions M1×M2. In some embodiments, the outer dimension L1 can be substantially identical to the outer dimension M1. In some embodiments, the outer dimension L1 can be different than the outer dimension M1. The outer dimension M1 can be different than the outer dimension M2. The outer dimension M2 can be smaller than the outer dimension M1. The outer dimension M2 can be smaller than the outer dimension L1.

Figures 6C, 6D:
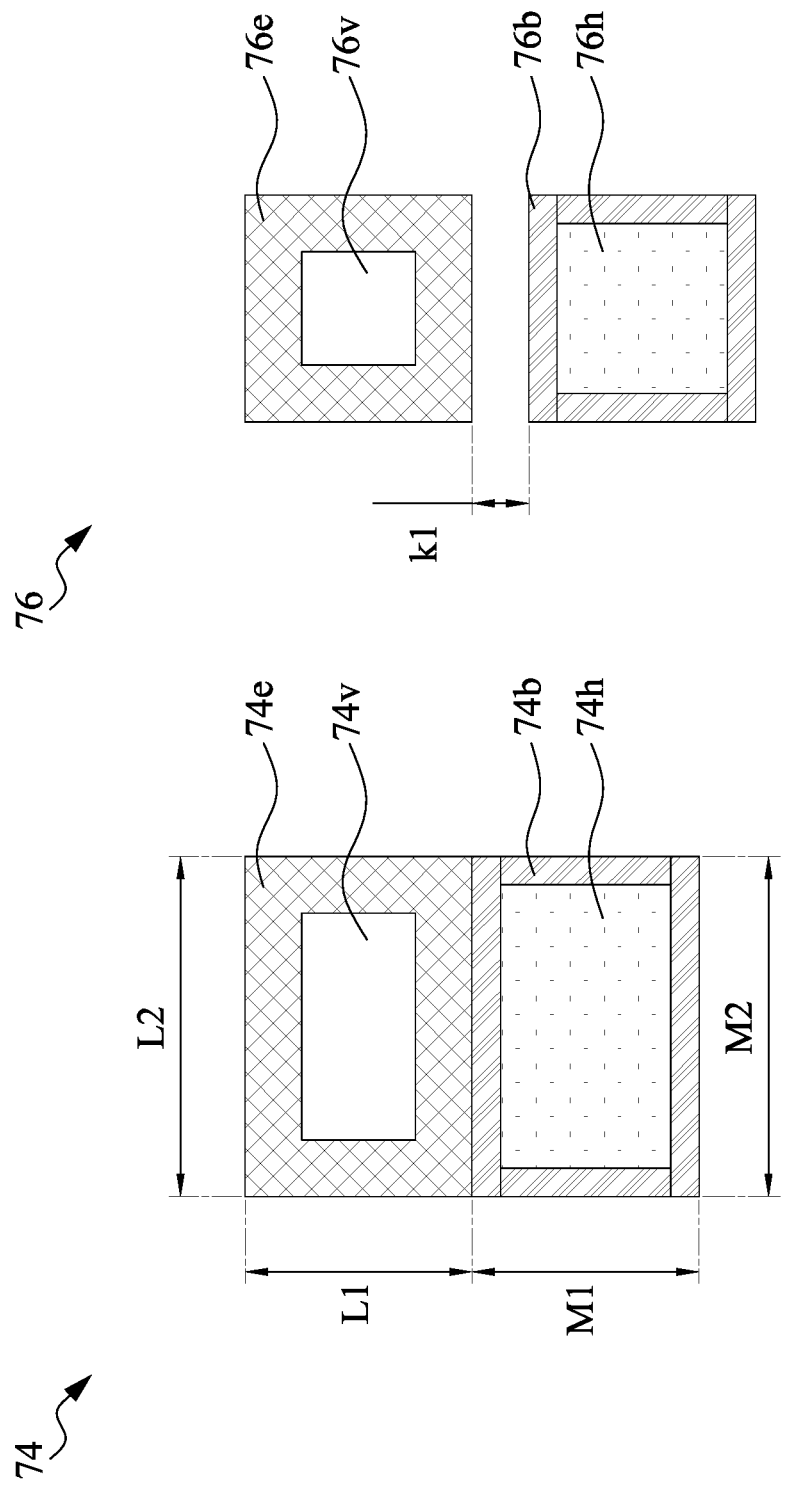
FIG. 6C is a top view of a layout of a semiconductor device, in accordance with some embodiments of the present disclosure.
FIG. 6D is a top view of a layout of a semiconductor device, in accordance with some embodiments of the present disclosure.

FIG. 6C is a top view of a layout of a semiconductor device, in accordance with some embodiments of the present disclosure.

FIG. 6C shows a layout 74. The layout 74 can be a top view of a semiconductor. The layout 74 includes regions for a conductive element 74v, empty space 74e, a header cell 74h, and a boundary cell 74b.

The region for the empty space 74e has outer dimensions L1×L2. The region for the header cell 74h has outer dimensions M1×M2. In some embodiments, the outer dimension L1 can be substantially identical to the outer dimension M1. In some embodiments, the outer dimension L1 can be different than the outer dimension M1. In some embodiments, the outer dimension L2 can be substantially identical to the outer dimension M2.

The outer dimension L1 can be different than the outer dimension L2. The outer dimension L2 can be greater than the outer dimension L1. The outer dimension L2 can be greater than the outer dimension M1. The outer dimension M1 can be different than the outer dimension M2. The outer dimension M2 can be greater than the outer dimension M1. The outer dimension M2 can be greater than the outer dimension L1.

FIG. 6D is a top view of a layout of a semiconductor device, in accordance with some embodiments of the present disclosure.

FIG. 6D shows a layout 76. The layout 76 can be a top view of a semiconductor. The layout 76 includes regions for a conductive element 76v, empty space 76e, a header cell 76h, and a boundary cell 76b.

The region for the empty space 76e can be spaced apart from the region for the header cell 76h by a distance k1. The distance k1 can be the minimum distance between the empty space 76e and the boundary cell 76b. The region for the empty space 76e can be spaced apart from the region for the boundary cell 76b by the distance k1.

Figure 6E:
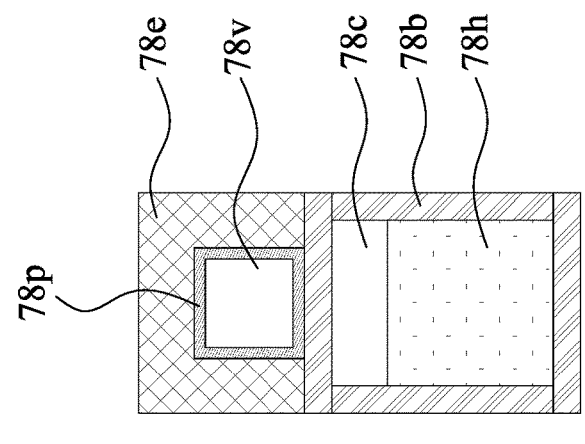
FIG. 6E is a top view of a layout of a semiconductor device, in accordance with some embodiments of the present disclosure.

FIG. 6E is a top view of a layout of a semiconductor device, in accordance with some embodiments of the present disclosure.

FIG. 6E shows a layout 78. The layout 78 can be a top view of a semiconductor. The layout 78 includes regions for a conductive element 78v, empty space 78e, a header cell 78h, and a boundary cell 78b. In the layout 78, the conductive element 78v is surrounded/covered by a protection layer 78p. The protection layer 78p can be an electrical insulation layer. The protection layer 78p can isolate the conductive element 78v from any circuit/device adjacent to the conductive element 78v.

With the protection layer 78p, a semiconductor component 78c can be disposed between the conductive element 78v and the header cell 78h.

The semiconductor component 78c disposed between the conductive element 78v and the header cell 78h can provide performance benefits to the overall system, while not adversely affecting function of the overall system if damaged. The semiconductor component 78c can be selected from a group consisting of: a dummy oxide diffusion structure, a dummy polysilicon structure, a decoupling capacitor, a metal capacitor, and a tap well.

Figure 7A:
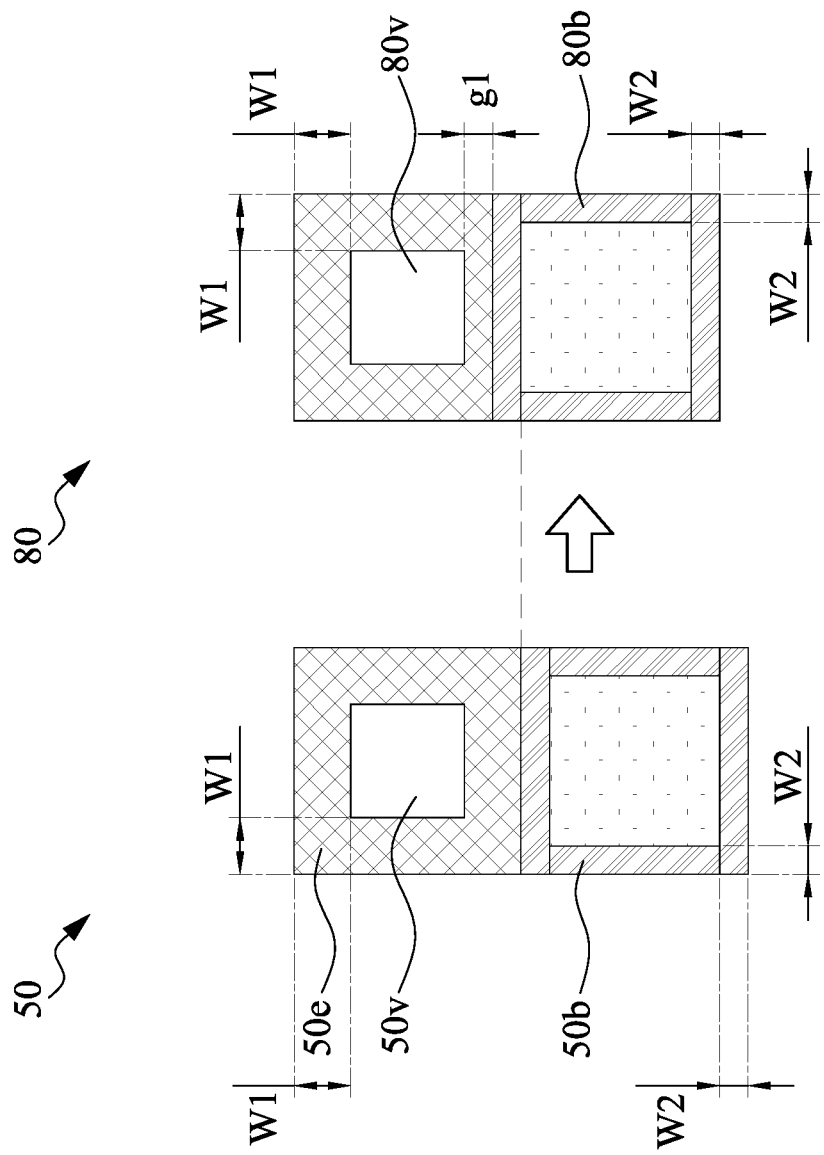
FIG. 7A is a top view of layouts of semiconductor devices, in accordance with some embodiments of the present disclosure.

FIG. 7A is a top view of layouts of semiconductor devices, in accordance with some embodiments of the present disclosure.

FIG. 7A shows layouts 50 and 80. The layout 50 is identical to that shown in FIG. 5A. The empty space 50e has a thickness W1, and the boundary cell 50b has a thickness W2. The minimum distance between the conductive element 50v and the boundary cell 50b is W1.

The layout 80 can be obtained by modifying the layout 50. The layout 80 can be obtained by moving the boundary cell 50b closer to the conductive element 50v. Referring to FIG. 7A, the minimum distance between the conductive element 80v and the boundary cell 80b is g1. The distance g1 is smaller than the thickness W1.

It should be noted that although the boundary cell 80b is closer to the conductive element 80v, the layout 80 can still function properly, even if the non-functional boundary cell 80b is damaged during the formation of the conductive element 80v. The layout 80 can have a total area smaller than that of the layout 50. As a result, the layout 80 can be more economic in terms of space.

Figure 7B:
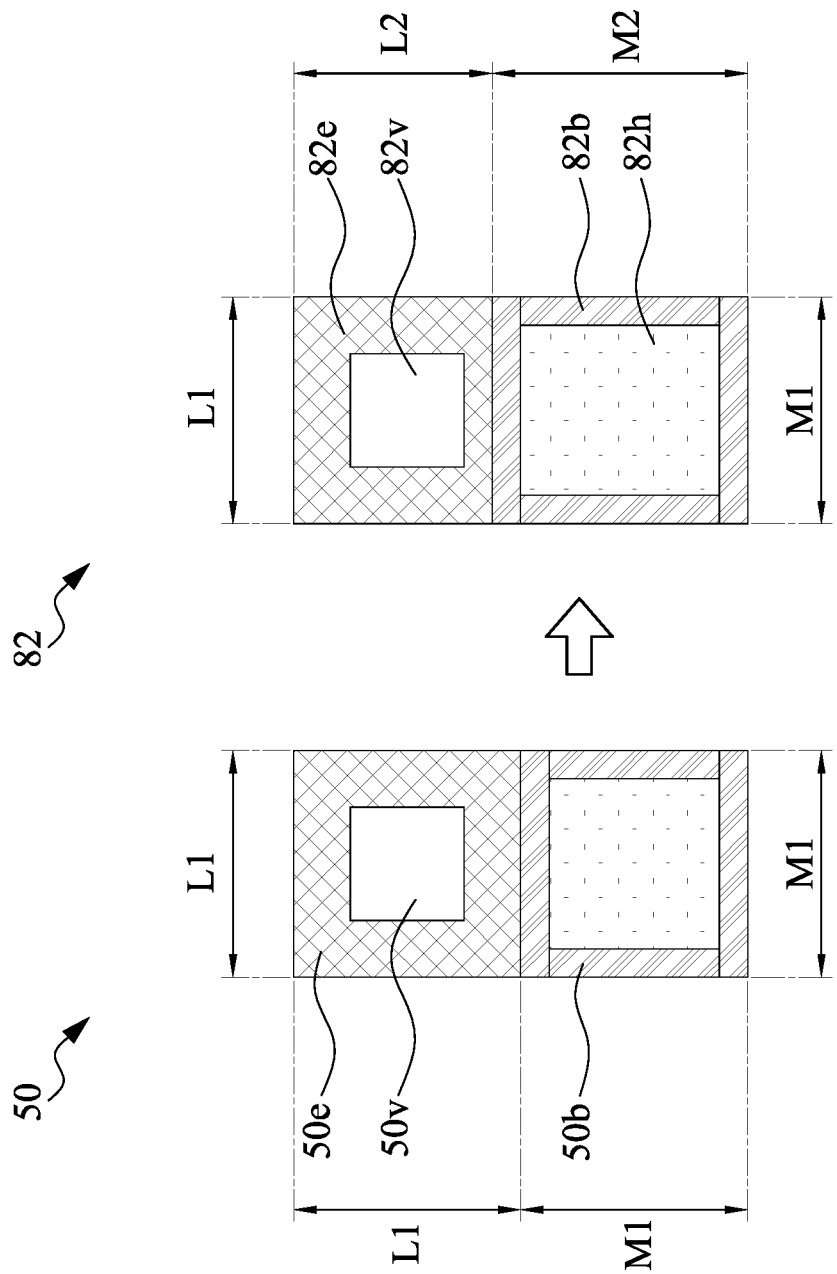
FIG. 7B is a top view of layouts of semiconductor devices, in accordance with some embodiments of the present disclosure.

FIG. 7B is a top view of layouts of semiconductor devices, in accordance with some embodiments of the present disclosure.

FIG. 7B shows layouts 50 and 82. The layout 50 is identical to that shown in FIG. 5A. The empty space 50e has outer dimensions L1×L1. The boundary cell 50b has outer dimensions M1×M1. The empty space 50e has a thickness W1, and the boundary cell 50b has a thickness W2.

The layout 82 can be obtained by modifying the layout 50. The layout 82 can be obtained by expanding the boundary cell 50b to be closer to the conductive element 50v. Referring to FIG. 7B, the empty space 82e has outer dimensions L1×L2, and the boundary cell 82b has outer dimensions M1×M2.

The outer dimension L1 can be substantially identical to the outer dimension M1. The outer dimension M2 can be greater than the outer dimension L2. The outer dimension M2 can be greater than the outer dimension M1. The outer dimension M2 can be greater than the outer dimension L1.

It should be noted that although the boundary cell 82b is closer to the conductive element 82v, the layout 82 can still function properly, even if the non-functional boundary cell 82b is damaged during the formation of the conductive element 82v. The layout 82 can have a total area identical to that of the layout 50, while have a greater effective area of the header cell 82h. As a result, the layout 82 can be more economic in terms of space.

Figure 7C:
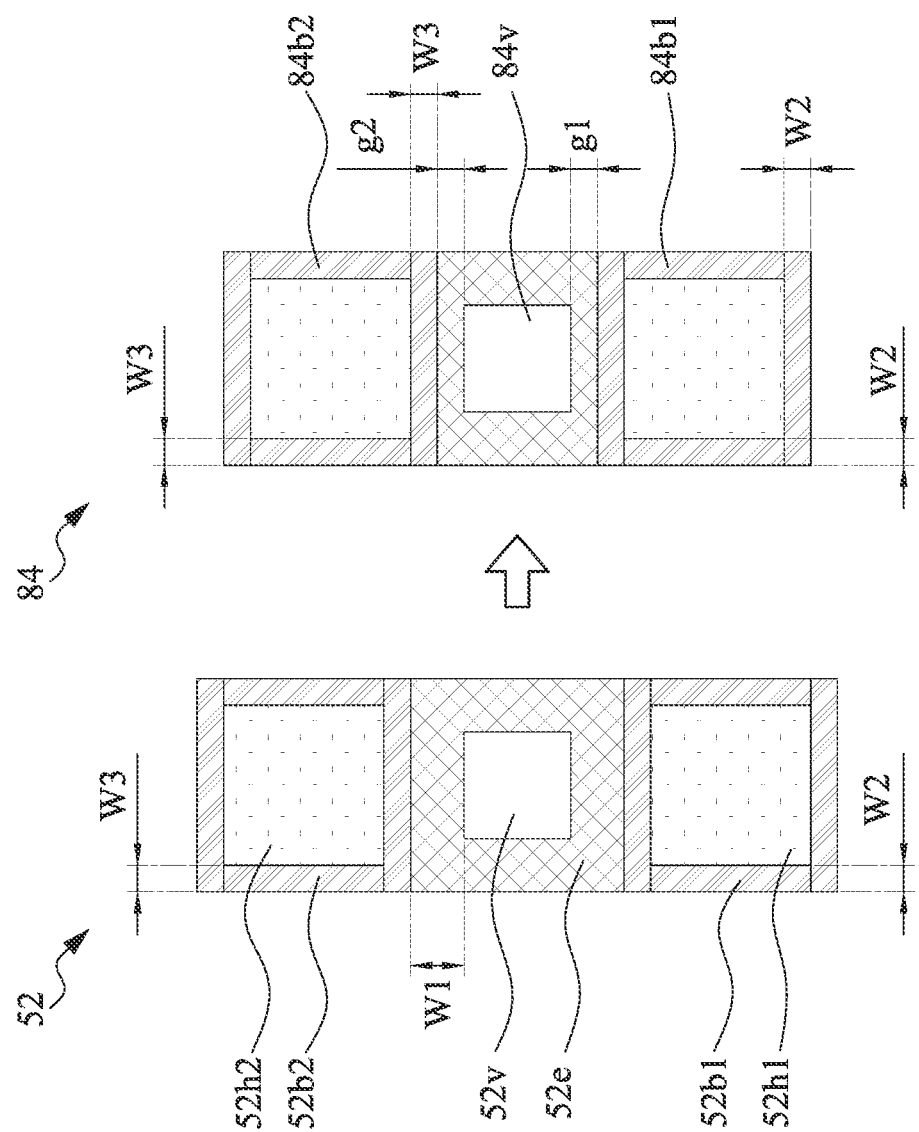
FIG. 7C is a top view of layouts of semiconductor devices, in accordance with some embodiments of the present disclosure.

FIG. 7C is a top view of layouts of semiconductor devices, in accordance with some embodiments of the present disclosure.

FIG. 7C shows layouts 52 and 84. The layout 52 is identical to that shown in FIG. 5B. The empty space 52e has a thickness W1, the boundary cell 52b1 has a thickness W2, and the boundary cell 52b2 has a thickness W3. The minimum distance between the conductive element 52v and the boundary cell 52b is W1. In some embodiments, the thicknesses of W1, W2 and W3 can be different. In some embodiments, the thicknesses of W1, W2 and W3 can be substantially identical.

The layout 84 can be obtained by modifying the layout 52. The layout 84 can be obtained by moving the boundary cells 52b1 and 52b2 closer to the conductive element 52v. Referring to FIG. 7C, the minimum distance between the conductive element 84v and the boundary cell 84b1 is g1, and the minimum distance between the conductive element 84v and the boundary cell 84b2 is g2. The distance g1 is smaller than the thickness W1. The distance g1 can be smaller than the thickness W2. The distance g2 is smaller than the thickness W1. The distance g2 can be smaller than the thickness W3.

The layout 84 can have a total area smaller than that of the layout 52. As a result, the layout 84 can be more economic in terms of space.

Figure 7D:
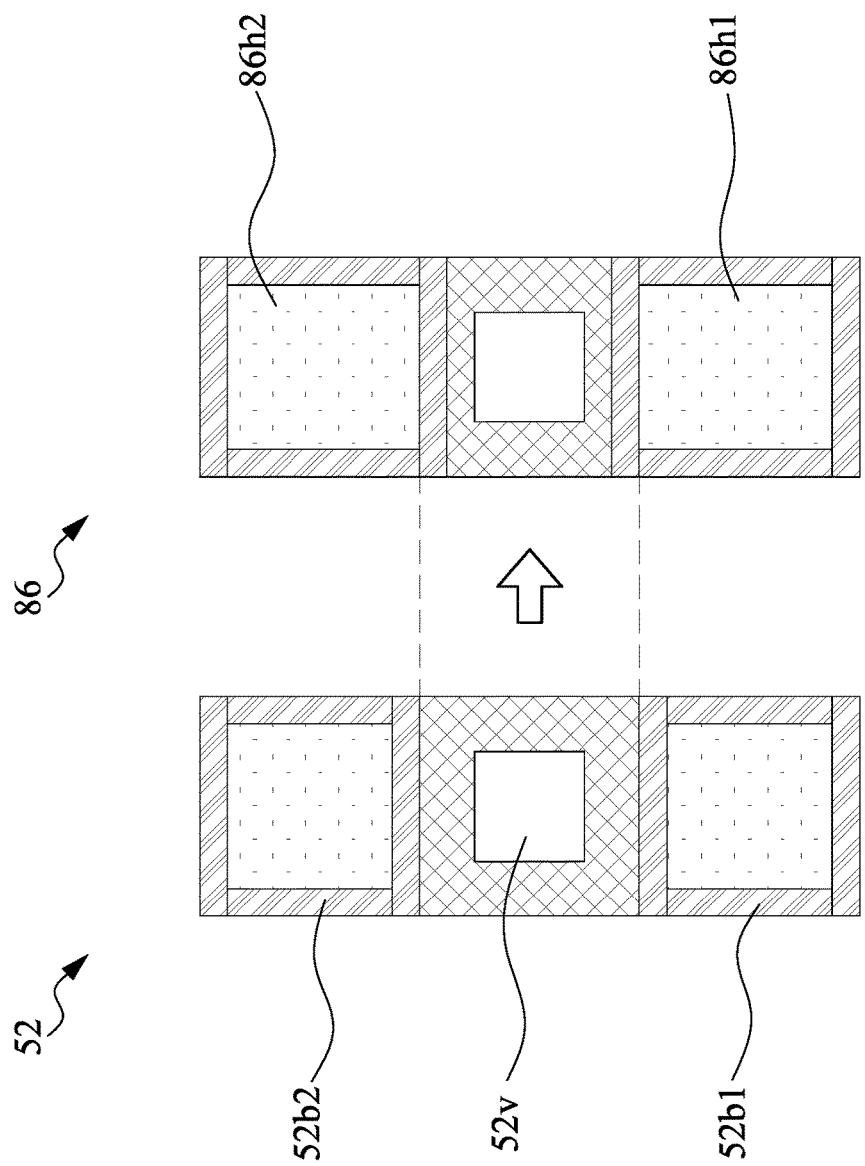
FIG. 7D is a top view of layouts of semiconductor devices, in accordance with some embodiments of the present disclosure.

FIG. 7D is a top view of layouts of semiconductor devices, in accordance with some embodiments of the present disclosure.

FIG. 7D shows layouts 52 and 86. The layout 52 is identical to that shown in FIG. 5B. The layout 86 can be obtained by modifying the layout 52. The layout 86 can be obtained by expanding the boundary cells 52b1 and 52b2 to be closer to the conductive element 52v. The layout 86 can have a total area identical to that of the layout 52, while have a greater effective area of the header cells 86h1 and 86h2. As a result, the layout 86 can be more economic in terms of space.

Figure 8A:
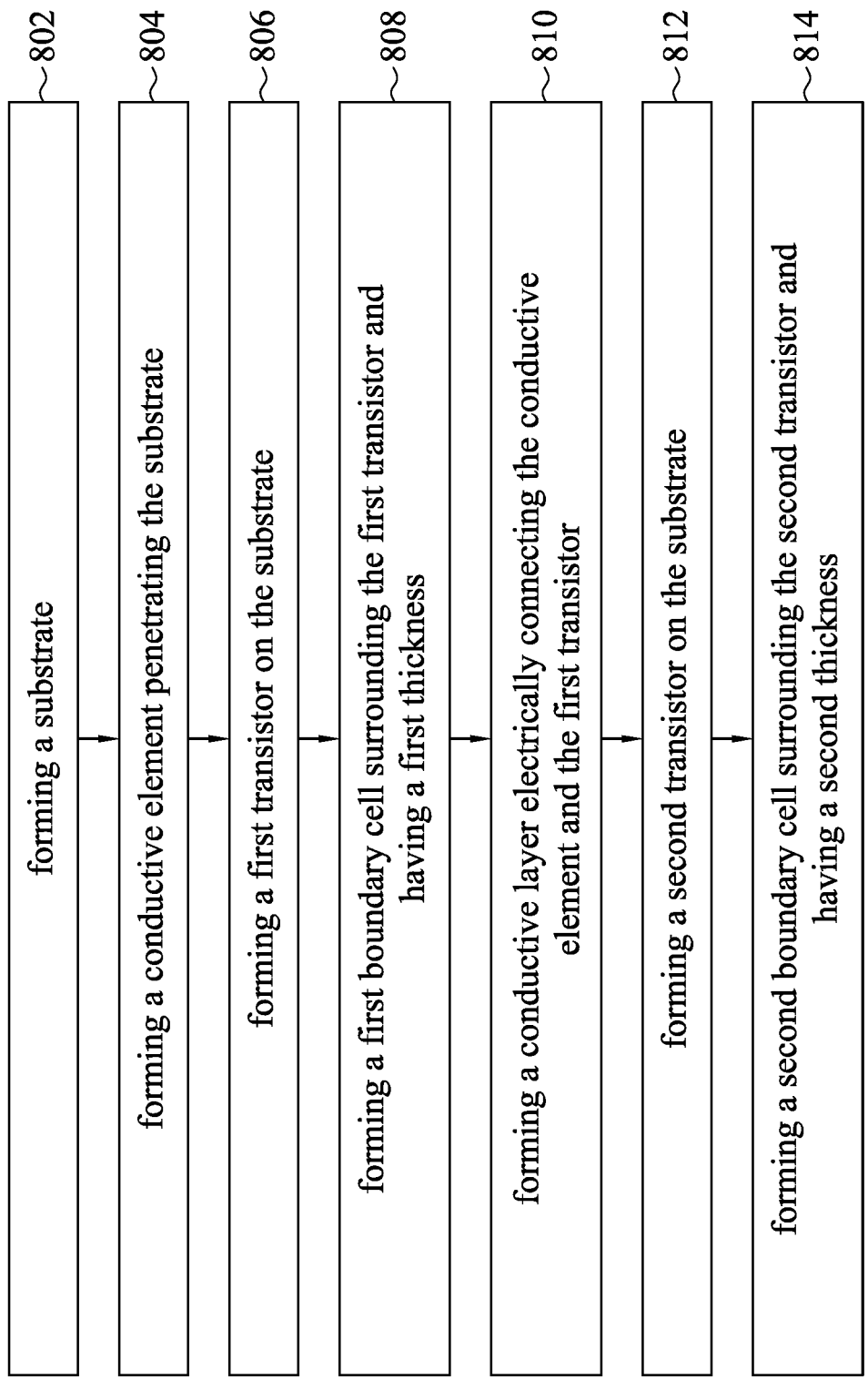
FIG. 8A is a flowchart of operations for manufacturing a semiconductor device, in accordance with some embodiments of the present disclosure.

FIG. 8A is a flowchart of operations for manufacturing a semiconductor device, in accordance with some embodiments of the present disclosure.

FIG. 8A includes operations 802, 804, 806, 808, 810, 812 and 814 for manufacturing a semiconductor device. In the operation 802, a substrate is formed. The substrate formed in the operation 802 can be the substrate 10 shown in FIG. 2A, 2B or 2C.

In the operation 804, a conductive element penetrating the substrate is formed. The conductive element formed in the operation 804 can be the conductive element 10v shown in FIG. 2A, 2B or 2C.

In the operation 806, a first transistor is formed on the substrate. The first transistor formed in the operation 806 can be the device 100 shown in FIGS. 2A and 2B, or the device 102 shown in FIG. 2C.

In the operation 808, a first boundary cell surrounding the first transistor and having a first thickness is formed. The first boundary cell formed in the operation 808 can be the boundary cell 50*b* shown in FIG. 5A, the boundary cells 52*b*1 and 52*b*2 shown in FIG. 5B, the boundary cells 54*b*1 or 54*b*2 shown in FIG. 5C, the boundary cells 56*b*1, 56*b*2 or 56*b*3 shown in FIG. 5D, or the boundary cells 58*b*1, 58*b*2, 58*b*3 or 58*b*4 shown in FIG. 5E.

In the operation 810, a conductive layer is formed to electrically connect the conductive element and the first transistor. The conductive layer formed in the operation 810 can be the metal layer 16*m*4' shown in FIG. 2A, 2B or 2C.

The first boundary cell formed in the operation 808 can be spaced apart from the conductive element formed in the operation 804 by a first distance, and the first distance is smaller than the first thickness of the first boundary cell. The first boundary cell formed in the operation 808 can be the boundary cell 80*b* shown in FIG. 7A, wherein the distance g1 between the boundary cell 80*b* and the conductive element 80*v* is smaller than the thickness W2 of the boundary cell 80*b*.

In the operation 812, a second transistor is formed on the substrate. The second transistor formed in the operation 812 can be the header cell 84*b*2 shown in FIG. 7C.

In the operation 814, a second boundary cell is formed to surround the second transistor and having a second thickness.

The second boundary cell formed in the operation 814 can be spaced apart from the conductive element formed in the operation 804 by a second distance, and the second distance is smaller than the second thickness of the second boundary cell. The second boundary cell formed in the operation 814 can be the boundary cell 84*b*2 shown in FIG. 7C, wherein the distance g2 between the boundary cell 84*b*2 and the conductive element 84*v* is smaller than the thickness W3 of the boundary cell 84*b*2.

Although the operations 802, 804, 806, 808, 810, 812 and 814 in FIG. 8A are depicted as in sequence, it can be contemplated that the operations 802, 804, 806, 808, 810, 812 and 814 can be performed in an order different from that shown in FIG. 8A.

Figure 8B:
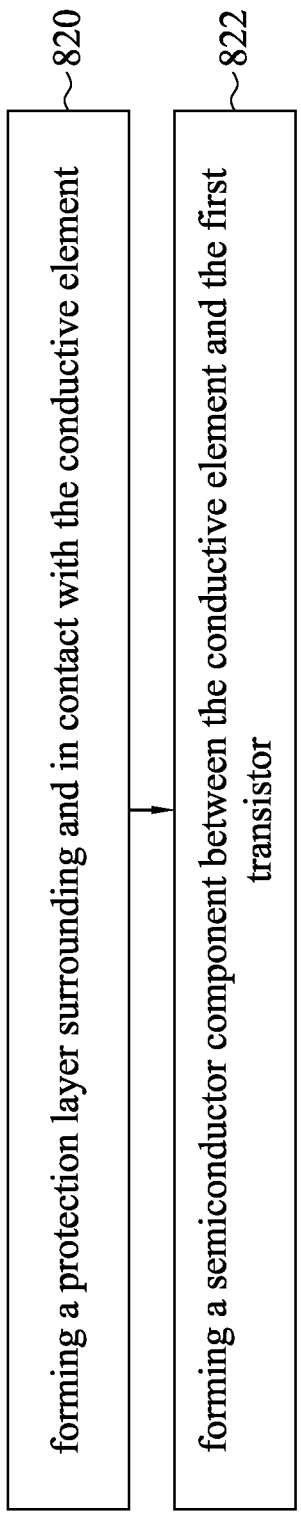
FIG. 8B is a flowchart of operations for manufacturing a semiconductor device, in accordance with some embodiments of the present disclosure.

FIG. 8B is a flowchart of operations for manufacturing a semiconductor device, in accordance with some embodiments of the present disclosure. FIG. 8B includes operations 820 and 822 for manufacturing a semiconductor device.

In the operation 820, a protection layer is formed to surround and in contact with the conductive element. The protection layer formed in the operation 820 can be the protection layer 10*p* shown in FIG. 2B, or the protection layer 78*p* shown in FIG. 6E.

In the operation 822, a semiconductor component is formed between the conductive element and the first transistor. The semiconductor component formed in the operation 822 can be the semiconductor component 78*c* shown in FIG. 6E.

It should be noted that the operations 820 and 822 shown in FIG. 8B may not be necessary after operations 806, 808, 810, 812 and 814 of FIG. 8A. It can be contemplated that the operation 820 can be performed after the operation 804, and that the operation 822 can be performed after the operation 806.

Some embodiments of the present disclosure provide a semiconductor device. The semiconductor device comprises a substrate, a conductive element disposed within a first region of the substrate, and a first transistor disposed within a second region adjacent to the first region of the substrate. The conductive element is electrically connected to an electrode of the first transistor, and the conductive element penetrates the substrate and is configured to receive a supply voltage.

Some embodiments of the present disclosure provide a semiconductor device. The semiconductor device comprises a substrate, a conductive element penetrating the substrate and is configured to receive a supply voltage, and a first transistor disposed on the substrate adjacent to the conductive element. The conductive element is surrounded by a first region (FIG. 7A: 50*e*) having a first thickness. The first transistor is surrounded by first boundary cell having a second thickness. A minimum distance between the first boundary cell and the conductive element is smaller than the first thickness.

Some embodiments of the present disclosure provide a method for manufacturing a semiconductor device. The method comprises forming a substrate, forming a conductive element penetrating the substrate, forming a first transistor on the substrate, forming a first boundary cell surrounding the first transistor and having a first thickness, and forming a conductive layer electrically connecting the conductive element and the first transistor. The first boundary cell is spaced apart from the conductive element by a first distance, and the first distance is smaller than the first thickness.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a conductive element disposed within a first region of the substrate;
a first transistor disposed on a second region of the substrate adjacent to the first region of the substrate; wherein
the conductive element is spaced apart from the first transistor and is electrically connected to an electrode of the first transistor through a first metal layer extending from the first region to the second region,
the first metal layer directly contacts the conductive element and is electrically connected to the electrode of the first transistor through a second metal layer disposed on the second region,
the conductive element penetrates through the substrate and is configured to receive a supply voltage, and
the first transistor is configured to control whether the supply voltage is provided to a subsequent element, wherein a path of the supply voltage from the first transistor to the subsequent element non-overlaps the conductive element vertically in a cross-sectional view.

2. The semiconductor device of claim 1, further comprising:
a second transistor disposed on a third region of the substrate adjacent to the first region of the substrate; wherein
the second region and the third region are located on opposite sides of the first region, and the conductive element is electrically connected to an electrode of the second transistor.

3. The semiconductor device of claim 1, further comprising:
a third transistor disposed on a fourth region of the substrate adjacent to the first region of the substrate; wherein
the second region is disposed adjacent to a first side of the first region facing a first direction,
the fourth region is disposed adjacent to a second side of the first region facing a second direction, and
the first direction is perpendicular to the second direction.

4. The semiconductor device of claim 3, further comprising:
a fourth transistor disposed on a fifth region of the substrate adjacent to the first region of the substrate; wherein
the fourth region and the fifth region are located on opposite sides of the first region.

5. The semiconductor device of claim 1, further comprising:
a second transistor, a third transistor and a fourth transistor disposed adjacent to the first region of the substrate; wherein
the first transistor, the second transistor, the third transistor and the fourth transistor are located on four sides of the first region, and
the conductive element is electrically connected to an electrode of each of the second transistor, the third transistor and the fourth transistor.

6. The semiconductor device of claim 2, further comprising:
a first conductive layer extending from the second region to the third region; and
a second conductive layer extending from the second region to the third region; wherein
the first conductive layer is isolated from the conductive element, and
the second conductive layer is electrically connected to the conductive element.

7. The semiconductor device of claim 6, wherein:
the electrode of the first transistor is electrically connected to the conductive element through the second conductive layer, and
the electrode of the second transistor is electrically connected to the conductive element through the second conductive layer.

8. The semiconductor device of claim 1, further comprising:
a protection layer surrounding and in contact with the conductive element; and
a semiconductor component disposed between the conductive element and the first transistor, wherein
the semiconductor component is selected from a group consisting of: a boundary cell, a dummy oxide diffusion structure, a dummy polysilicon structure, a decoupling capacitor, a metal capacitor, and a tap well.

9. A semiconductor device, comprising:
a substrate;
a conductive element penetrating through the substrate and including a surface exposed by the substrate; and
a first transistor disposed on the substrate and spaced apart from the conductive element; wherein
the conductive element is surrounded by an empty region, wherein the empty region includes a first portion having a first width and a second portion having a second width different from the first width,
the first transistor is surrounded by a first boundary cell adjacent to the second portion of the empty region,
the first transistor is electrically connected to the conductive element through a first conductive layer extending from the first transistor to the conductive element, and
the first conductive layer directly contacts the conductive element and is electrically connected to the electrode of the first transistor through a second conductive layer which is spaced apart from the conductive element.

10. The semiconductor device of claim 9, further comprising:
a second transistor disposed on the substrate adjacent to the conductive element; wherein
the empty region further includes a third portion having a third width,
the third portion extends in a direction perpendicular to that of the first portion, and the third width is different from the first width, and
the second transistor is surrounded by a second boundary cell adjacent to the third portion of the empty region.

11. The semiconductor device of claim 9, further comprising:
a protection layer surrounding and in contact with the conductive element; and
a semiconductor component disposed between the conductive element and the first transistor, wherein
the semiconductor component is selected from a group consisting of: a dummy oxide diffusion structure, a dummy polysilicon structure, a decoupling capacitor, a metal capacitor, and a tap well.

12. The semiconductor device of claim 9, wherein:
the empty region includes a first outer dimension and a second outer dimension,
the first boundary cell includes a third outer dimension and a fourth outer dimension, and
one of the first outer dimension and the second outer dimension is different than one of the third outer dimension and the fourth outer dimension.

13. The semiconductor device of claim 9, wherein:
the empty region includes a fifth outer dimension and a sixth outer dimension,
the first boundary cell includes a seventh outer dimension and an eighth outer dimension,
the fifth outer dimension is identical to the seventh outer dimension, and
the eighth outer dimension is greater than the sixth outer dimension.

14. The semiconductor device of claim 10, further comprising:
a second conductive layer extending from the first transistor to the second transistor; wherein
the second transistor is electrically connected to the conductive element through the second conductive layer.

15. The semiconductor device of claim 1, wherein a surface of the conductive element is exposed by the substrate.

16. The semiconductor device of claim 1, wherein:
the first region includes a first outer dimension and a second outer dimension,
the second region includes a third outer dimension and a fourth outer dimension, and
one of the first outer dimension and the second outer dimension is different from one of the third outer dimension and the fourth outer dimension.

17. The semiconductor device of claim 16, wherein the fourth outer dimension is smaller than the second outer dimension.

18. The semiconductor device of claim 1, wherein:
the first region includes a fifth outer dimension and a sixth outer dimension,
the second region includes a seventh outer dimension and an eighth outer dimension,
the fifth outer dimension is identical to the seventh outer dimension, and
the eighth outer dimension is greater than the sixth outer dimension.

19. The semiconductor device of claim 3, further comprising:
a fifth transistor disposed on a sixth region of the substrate adjacent to the second region and the fourth region.

20. A semiconductor device, comprising:
a first device, comprising:
  a substrate;
  a conductive element disposed within a first region of the substrate;
  a first transistor disposed on a second region of the substrate adjacent to the first region of the substrate, and disposed a first side of the first device;
  a first metal layer disposed on the first side of the first device and extending from the first region to the second region; wherein
  the conductive element is spaced apart from the first transistor and is electrically connected to an electrode of the first transistor through the first metal layer, and
  the conductive element penetrates through the substrate and is configured to receive a supply voltage, and
a second device stacked on the first side of the first device, wherein the first transistor is configured to control whether the supply voltage is provided to the second device, wherein a path of the supply voltage from the first transistor to the second device non-overlaps the conductive element vertically in a cross-sectional view.

* * * * *